United States Patent
Cho et al.

(10) Patent No.: US 9,567,669 B2
(45) Date of Patent: Feb. 14, 2017

(54) CHEMICAL VAPOR DEPOSITION APPARATUS AND METHOD OF MANUFACTURING LIGHT-EMITTING DIODE DEVICE USING THE SAME

(71) Applicants: Seong-Joon Cho, Osan-si (KR); Hyun-Su Cho, Suwon-si (KR)

(72) Inventors: Seong-Joon Cho, Osan-si (KR); Hyun-Su Cho, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/957,548

(22) Filed: Dec. 2, 2015

(65) Prior Publication Data
US 2016/0160349 A1    Jun. 9, 2016

(30) Foreign Application Priority Data
Dec. 4, 2014 (KR) .......................... 10-2014-0173232

(51) Int. Cl.
C23C 16/44 (2006.01)
H01L 33/00 (2010.01)
H01L 21/687 (2006.01)

(52) U.S. Cl.
CPC ..... C23C 16/4412 (2013.01); H01L 21/68764 (2013.01); H01L 21/68771 (2013.01); H01L 33/005 (2013.01)

(58) Field of Classification Search
CPC .......... C23C 16/4412; H01L 21/68764; H01L 21/68771; H01L 33/005
USPC ..................................... 156/345.55; 118/730
See application file for complete search history.

(56) References Cited

U.S. PATENT DOCUMENTS

| | | | | |
|---|---|---|---|---|
| 4,503,807 A | * | 3/1985 | Nakayama | C23C 16/455 118/719 |
| 4,976,996 A | * | 12/1990 | Monkowski | C23C 16/455 118/719 |
| 4,991,540 A | * | 2/1991 | Jurgensen | C23C 16/4583 118/715 |
| 5,891,251 A | * | 4/1999 | MacLeish | C23C 16/0227 118/719 |

(Continued)

FOREIGN PATENT DOCUMENTS

| | | |
|---|---|---|
| JP | 2004211168 | 7/2004 |
| KR | 20120092418 | 8/2012 |

(Continued)

OTHER PUBLICATIONS

Dauelsberg, M. et al., "Modeling and process design of III-nitride MOVPE at near-atmospheric pressure in close coupled showerhead and planetary reactors," Journal of Crystal Growth 298, (2007), available online Nov. 20, 2006, pp. 418-424.

*Primary Examiner* — Rudy Zervigon
(74) *Attorney, Agent, or Firm* — Renaissance IP Law Group LLP

(57) ABSTRACT

An embodiment includes an apparatus, comprising: a chamber; a main disk that is rotatably disposed in a chamber and configured to receive a substrate; a gas supply unit configured to supply a process gas to the chamber; a gas collector unit including a gas exhaust channel separate from the main disk and vertically lower than the main disk; and a skirt unit disposed on a peripheral portion of the main disk and configured to reduce turbulence of the process gas flowing to the gas collector unit.

11 Claims, 27 Drawing Sheets

(56) References Cited

U.S. PATENT DOCUMENTS

| | | | |
|---|---|---|---|
| 6,075,922 A * | 6/2000 | Tay | F26B 21/10 |
| | | | 392/416 |
| 6,331,212 B1 * | 12/2001 | Mezey, Sr. | H01L 21/67109 |
| | | | 118/724 |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,524,532 B2 | 4/2009 | Jurgensen et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,043,432 B2 * | 10/2011 | Dip | C23C 16/45508 |
| | | | 118/719 |
| 8,049,161 B2 | 11/2011 | Sherrer et al. | |
| 8,129,711 B2 | 3/2012 | Kang et al. | |
| 8,152,924 B2 * | 4/2012 | Dauelsberg | C23C 16/45508 |
| | | | 118/715 |
| 8,157,915 B2 | 4/2012 | Dauelsberg et al. | |
| 8,179,938 B2 | 5/2012 | Kim | |
| 8,263,987 B2 * | 9/2012 | Choi et al. | |
| 8,324,646 B2 | 12/2012 | Lee et al. | |
| 8,343,317 B2 | 1/2013 | Carlson | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,018,105 B2 * | 4/2015 | Strauch | C23C 16/4412 |
| | | | 438/763 |
| 9,382,642 B2 * | 7/2016 | Yarlagadda | C23C 16/46 |
| 2004/0200412 A1 * | 10/2004 | Frijlink | C23C 16/4412 |
| | | | 118/715 |
| 2005/0011435 A1 * | 1/2005 | Dauelsberg | C23C 16/4411 |
| | | | 117/92 |
| 2006/0107973 A1 | 5/2006 | Leung | |
| 2006/0272561 A1 | 12/2006 | Chang et al. | |
| 2009/0064935 A1 * | 3/2009 | Dauelsberg | C23C 16/4405 |
| | | | 118/724 |
| 2009/0114155 A1 * | 5/2009 | Sawayama | C23C 16/24 |
| | | | 118/724 |
| 2010/0047450 A1 * | 2/2010 | Li | C23C 16/4412 |
| | | | 427/255.28 |
| 2010/0136795 A1 * | 6/2010 | Honma | C23C 16/45551 |
| | | | 438/758 |
| 2012/0149212 A1 * | 6/2012 | Strauch | C23C 16/4412 |
| | | | 438/763 |
| 2012/0204796 A1 | 8/2012 | Witt | |
| 2014/0216341 A1 | 8/2014 | Begarney et al. | |
| 2016/0138159 A1 * | 5/2016 | Kato | C23C 16/4584 |
| | | | 118/730 |
| 2016/0160349 A1 * | 6/2016 | Cho | H01L 33/005 |
| | | | 438/22 |

FOREIGN PATENT DOCUMENTS

| | | |
|---|---|---|
| KR | 20130078976 | 7/2013 |
| KR | 101334643 | 12/2013 |

* cited by examiner 4300
4320
4310
4340

CHEMICAL VAPOR DEPOSITION APPARATUS AND METHOD OF MANUFACTURING LIGHT-EMITTING DIODE DEVICE USING THE SAME

CROSS-REFERENCE TO RELATED APPLICATION

This application claims the benefit of Korean Patent Application No. 10-2014-0173232, filed on Dec. 4, 2014, in the Korean Intellectual Property Office, the disclosure of which is incorporated herein in its entirety by reference.

BACKGROUND

Embodiments relate to a chemical vapor deposition (CVD) apparatus and a method of manufacturing a light-emitting diode (LED) device using the same, and more particularly, to a CVD apparatus including a gas collector unit, and a method of manufacturing an LED device using the same.

An LED device (LED chip) may be manufactured by depositing various kinds of semiconductor layers on a substrate. The semiconductor layers may be deposited by loading the substrate into a chamber of a CVD apparatus and supplying process gases to the chamber. During the depositing of the semiconductor layers, parasitic materials unused among the process gases may be deposited within the chamber, without being exhausted to the outside of the chamber.

SUMMARY

An embodiment includes a method of manufacturing a light-emitting diode (LED) device, the method comprising: mounting a substrate on a main disk that is rotatably disposed in a chamber; introducing a process gas from a gas supply unit over the substrate loaded into the chamber; exhausting the process gas through a gas exhaust channel of a gas collector unit over a skirt unit in a peripheral portion of the main disk; and growing a light-emitting structure on the substrate by reacting the process gas in the chamber; wherein the gas collector unit is separate from the main disk and vertically lower than the main disk.

An embodiment includes an apparatus, comprising: a chamber; a main disk that is rotatably disposed in a chamber and configured to receive a substrate; a gas supply unit configured to supply a process gas to the chamber; a gas collector unit including a gas exhaust channel separate from the main disk and vertically lower than the main disk; and a skirt unit disposed on a peripheral portion of the main disk and configured to reduce turbulence of the process gas flowing to the gas collector unit.

An embodiment includes an apparatus, comprising: a chamber; a main disk disposed in the chamber; a gas supply unit configured to supply a process gas to the chamber; a gas collector unit disposed along a periphery of the main disk and configured to receive the process gas; and a skirt unit disposed between the main disk and the gas collector unit, and curved towards the gas collector unit.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
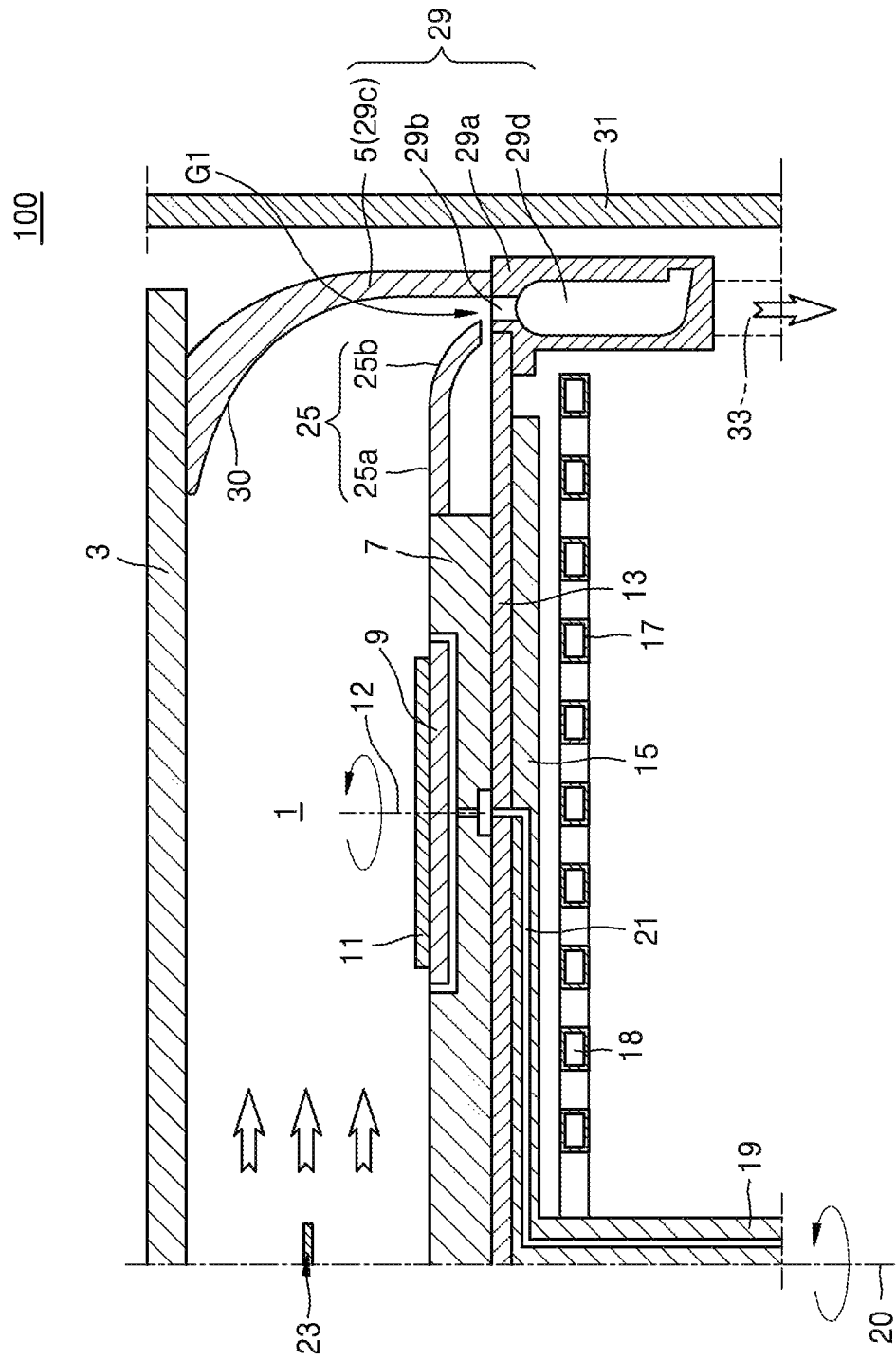
FIG. 1 is a partial cross-sectional view of a chemical vapor deposition (CVD) apparatus for manufacturing a light-emitting diode (LED) device, according to an embodiment.

Hereinafter, embodiments will be described with reference to the accompanying drawings. Embodiments may, however, take many different forms and should not be construed as being limited to the particular embodiments set forth herein; rather, these embodiments are provided so that this disclosure will be thorough and complete, and will fully convey the concept to those of ordinary skill in the art. It should be understood, however, that there is no intent to be limited to the particular forms disclosed, but on the contrary, embodiments cover all modifications, equivalents, and alternatives falling within the spirit and scope. In the drawings, the dimensions of structures are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms "first", "second", "third", etc. may be used herein to describe various elements, these elements should not be limited by these terms. These terms are only used to distinguish one element from another. For example, a first element may be referred to as a second element, and similarly, a second element may be referred to as a first element without departing from the scope.

Relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, embodiments will be described with reference to the accompanying drawings. In the accompanying drawings, the modifications of the illustrated shapes may be expected according to manufacturing technologies and/or tolerance. Therefore, embodiments should not be construed as being limited to specific shapes of the illustrated regions. The shapes may be changed during the manufacturing processes. The following embodiments may be combined.

Chemical vapor deposition (CVD) apparatuses used herein may have various configurations. However, only particular configurations are described herein, and embodiments are not limited thereto.

FIG. 1 is a partial cross-sectional view of a CVD apparatus 100 for manufacturing an LED device, according to an embodiment. Specifically, one half of the CVD apparatus 100 for manufacturing a light-emitting diode (LED) device is illustrated in FIG. 1, and the other half of the CVD apparatus 100 is symmetrical thereto and is not illustrated for convenience. The CVD apparatus 100 may be a metal organic CVD (MOCVD) apparatus. The CVD apparatus 100 may include a chamber 1, a main disk 7, a gas supply unit 23, a skirt unit 25, and a gas collector unit 29.

The chamber 1 has a ceiling 3 and a sidewall 5 that define an inner space. The main disk 7 is positioned in the chamber 1. The main disk 7 may be annular as described below. The main disk 7 may be made of graphite, for example. The main disk 7 may be a susceptor on which a substrate 11 is mountable. The substrate 11 may be a semiconductor wafer, a conductive wafer, an insulating wafer, or the like.

The main disk 7 may have a recessed surface and constitutes the bottom of the chamber 1. A support 19 is rotatable by a driver (not illustrated). Accordingly, the main disk 7 may be rotated around a rotational axis 20 disposed at the support 19 in the central portion of the CVD apparatus 100.

A satellite disk 9, on which the substrate 11 is mountable, may be disposed in the main disk 7. Although only one satellite disk 9 is illustrated, multiple satellite disks 9 may be installed in the CVD apparatus 100 as described below. The satellite disk 9 may be installed in the recessed portion of the main disk 7. The satellite disk 9 may be annular as described below. The satellite disk 9 may be a substrate holder that supports the substrate 11. A support gas supply line 21 may be installed in the support 19 and the main disk 7. Support gases may be introduced into the recessed portion through the support gas supply line 21. Accordingly, the satellite disk 9 may be rotated while being supported around the rotational axis 12 in a floating state due to a gas cushion, that is, a gas jet. Thus, the substrate 11, which is mounted on the satellite disk 9 within the main disk 7, may be rotated around the rotational axes 12 and 20.

A lower portion of the chamber 1 is partitioned by the main disk 7. The main disk 7 may be mounted on a support plate 13 made of quartz or other similar material. The support plate 13 may be mounted on a distribution plate 15. The support gases may be transferred to the main disk 7 by the distribution plate 15. An RF heating coil 17 may be spirally disposed under the main disk 7, the support plate 13, and the distribution plate 15. The RF heating coil 17 may be provided to heat the main disk 7. The RF heating coil 17 may have a hole through which a cooling medium (for example, water) flows. Accordingly, the RF heating coil 17 may have a hollow body. Although the RF heating coil 17 has been described as having a spiral configuration, the RF heating coil 17 may have other configurations.

An RF alternating magnetic field, which is generated by the RF heating coil 17, excites an eddy current in the conductive main disk 7. Since the eddy current causes heat generation in the main disk 7 due to an electric resistance thereof, the main disk 7 may be heated to about 600° C. to about 1,300° C.

The gas supply unit 23 may be disposed in the central portion of the chamber 1. The gas supply unit 23 is configured to supply a process gas to the chamber 1. The gas supply unit 23 may be a horizontal gas supply unit configured to supply the process gas to the central portion of the chamber 1, that is, from the gas supply unit 23 to the sidewall 5 of the chamber 1. A specific configuration of the gas supply unit 23 will be described below in detail.

The process gas introduced into the chamber 1 through the gas supply unit 23 is decomposed on the surface of the substrate 11 disposed substantially on the satellite disk 9. The substrate 11 may have a surface temperature suitable for thermal decomposition. Accordingly, in a particular embodiment, a decomposition product grown as a single-crystal group III-V layer may be formed on the surface of the substrate 11.

The skirt unit 25 is connected to a peripheral portion (circumferential portion) of the main disk 7. The skirt unit 25 may be integrally formed with the main disk 7. The skirt unit 25 may be annular. Similar to the main disk 7, the skirt unit 25 may have an annular shape in the peripheral portion of the annular main disk 7. The skirt unit 25 may be rotated together when the main disk 7 is rotated. The skirt unit 25 may have a flat surface 25a substantially parallel to the surface of the substrate 11, and a curved surface 25b connected to the flat surface 25a and curved in a direction of a gas exhaust channel 29b of the gas collector unit 29. Although a particular shape of the curvature of the curved surface 25b is illustrated, the curved surface 25b may have other shapes.

The flat surface 25a of the skirt unit 25 may be substantially parallel to the flow of the process gas flowing from the gas supply unit 23 to the gas collector unit 29. The skirt unit 25 may be configured to transfer the process gas to the gas collector unit 29 by enabling the process gas to smoothly flow from the central portion of the chamber 1 in a horizontal direction. The skirt unit 25 may be installed between the main disk 7 and the gas collector unit 29 and reduce or prevent turbulence of the process gas flowing from the gas supply unit 23 to the gas collector unit 29. In addition, since the skirt unit 25 may be rotated together when the main disk 7 is rotated, it is possible to easily remove parasitic deposition materials deposited around the gas exhaust channel 29b of the gas collector unit 29.

The gas collector unit 29 may be installed adjacent to the skirt unit 25 on one side of the chamber 1. The gas collector unit 29 may be disposed spaced apart from the main disk 7 and may be vertically lower than the main disk 7. The process gas, which is supplied through the central portion of the chamber 1, may be exhausted to the outside through the gas collector unit 29. The gas collector unit 29 may collect the process gas and exhaust the collected process gas.

The gas collector unit 29 may include lower collectors 29a and 29d, the gas exhaust channel 29b, and an upper collector 29c. The upper collector 29c may be part of the sidewall 5. Accordingly, the sidewall 5 may be referred to as the upper collector 29c. The lower collectors 29a and 29d may include a collector body 29a and a gas collection unit 29d disposed in the collector body 29a. The lower collectors 29a and 29d may be positioned at a downstream side separate from the main disk 7. The lower collectors 29a and 29d are separate from the main disk 7 in a horizontal direction and are lower than the main disk 7 in a vertical direction.

The lower collectors 29a and 29d may be actively heated by a heating mechanism associated with the lower collectors 29a and 29d. The lower collectors 29a and 29d may be made of molybdenum, graphite, or other similar materials. The lower collectors 29a and 29d may be positioned in a lower peripheral portion of the skirt unit 25. The lower collectors 29a and 29d may be directly adjacent to the outer peripheral portion of the support plate 13 in an annular shape.

The lower collectors 29a and 29d may include the gas exhaust channel 29b having an opening channel shape that is opened upward. The gas exhaust channel 29b may be an annular opening channel formed in an upper portion of the collector body 29a and may be connected to the gas collection unit 29d. The gas exhaust channel 29b may be installed adjacent to the peripheral portion of the skirt unit 25. Similar to the skirt unit 25, the gas exhaust channel 29b may be provided in an annular shape in the peripheral portion of the annular skirt unit 25.

A gap G1 is formed between the sidewall 5 and the skirt unit 25 of the chamber 1, and the process gas may be exhausted through the gap G1. The gap G1 may be a gap between the skirt unit 25 and the upper collector 29c. The gap G1 may be about 0.5 mm to about 30 mm. The gap G1 may be about 0.5 mm to about 3 mm. The gas exhaust channel 29b may be positioned under the gap G1 between the sidewall 5 and the skirt unit 25 of the chamber 1. Accordingly, the process gas may be exhausted through the gap G1 and the gas exhaust channel 29b.

The upper collector 29c may be disposed spaced apart from the skirt unit 25 and correspond to the sidewall 5 of the chamber 1. The upper collector 29c may constitute the sidewall 5 of the chamber 1. The process gas may be exhausted through the gas exhaust channel 29b and flow into the gas collection unit 29d. The gas collection unit 29d may be connected to a vacuum pump (not illustrated) through an exhaust channel 33 and exhaust the process gas to the outside.

The upper collector 29c, the lower collector 29a, and the gas exhaust channel 29b may be a fixed member, and the satellite disk 9, the main disk 7, and the skirt unit 25 may be rotatable members that are rotatable around the fixed member. Due to the rotation of the rotatable member, parasitic deposition materials attached to the fixed member may be removed.

The chamber 1 may be positioned in a housing 31 configured to protect the CVD apparatus 100 from external environment in an airtight manner. The housing 31 may surround a portion of the chamber 1. The housing 31 may be made of stainless steel or other similar material. An upper wall of the chamber 1 may be defined by the ceiling 3 that is made of graphite or other similar material. Optionally, the ceiling 3 of the chamber 1 may be separately heated.

Figure 2:
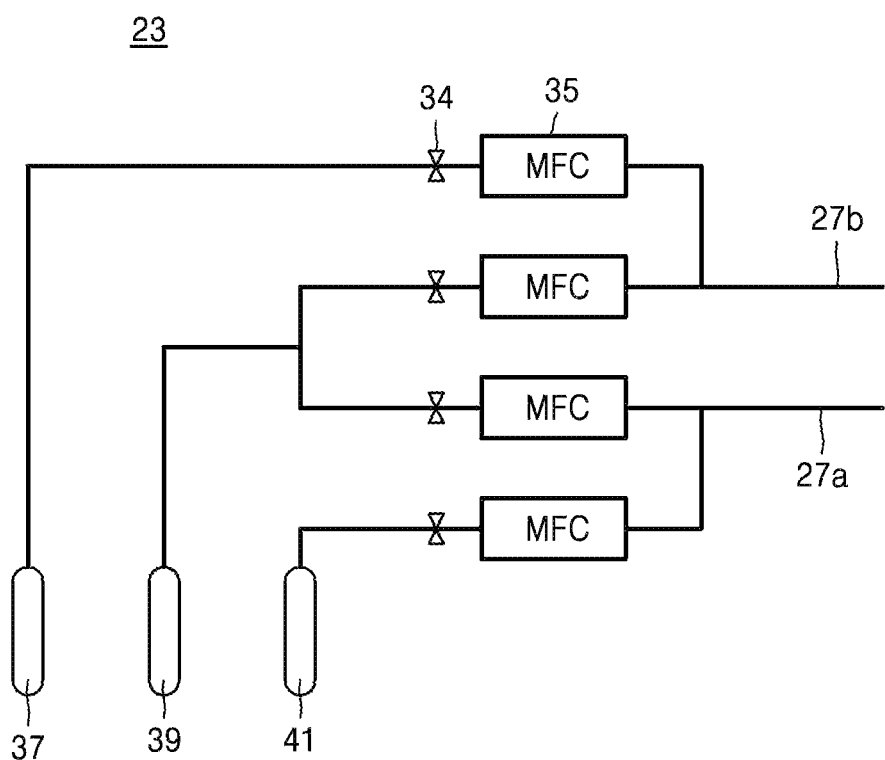
FIG. 2 is a schematic diagram of a gas supply unit of the CVD apparatus of FIG. 1.

FIG. 2 is a schematic diagram of the gas supply unit 23 of the CVD apparatus 100 of FIG. 1. Specifically, the gas supply unit 23 is configured to supply the process gas to the chamber 1 of FIG. 1. The process gas may include a deposition gas and a carrier gas. The gas supply unit 23 may include a storage tank 37 configured to store an organic metal material as the deposition gas, a storage tank 39 configured to store the carrier gas, and a storage tank 41 configured to store hydride as the deposition gas. Examples of the organic metal material may include TMGa (trimethylgallium $Ga(CH_3)_3$), TMIn (trimethylindium $In(CH_3)_3$), and TMAl (trimethylaluminum, $Al(CH_3)_3$). Examples of the carrier gas may include hydrogen, nitrogen, and inert gas. Examples of the hydride may include $AsH_3$, $PH_3$, and $NH_3$.

The gas supply unit 23 may include gas supply lines 27a and 27b connected to the storage tanks 37, 39, and 41. The gas supply line 27a may be a gas line configured to supply the hydride as the deposition gas. The gas supply line 27b may be a gas line configured to supply the organic metal material as the deposition gas. Valves 34 and mass flow controllers 35 may be installed in the gas supply lines 27a and 27b. The mass flow controllers 35 may be configured to control the flow of the gases passing through the gas supply lines 27a and 27b.

Figure 3:
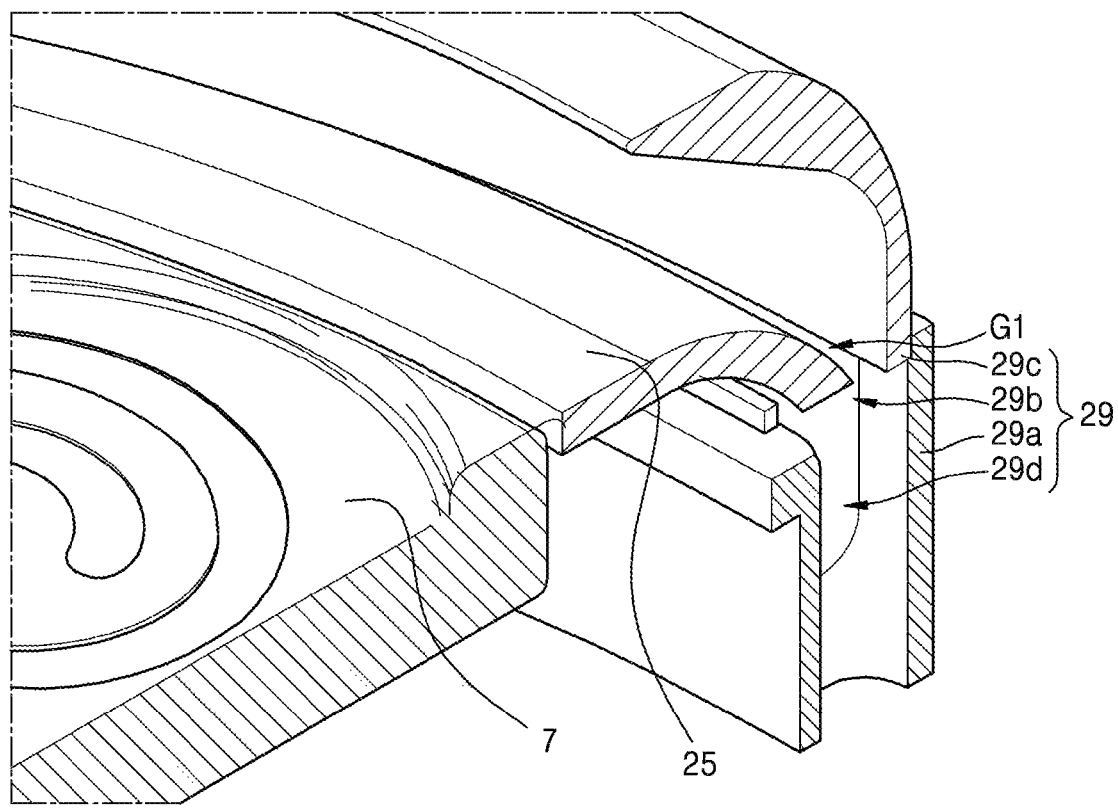
FIG. 3 is a partial perspective view of a skirt unit and a gas collector unit in the CVD apparatus of FIG. 1.

FIG. 3 is a partial perspective view of the skirt unit 25 and the gas collector unit 29 in the CVD apparatus 100 of FIG. 1. Specifically, as described above, the CVD apparatus 100 of FIG. 1 may include the main disk 7 on which the substrate 11, the skirt unit 25 connected to the main disk 7, and the gas collector unit 29 disposed outside of the skirt unit 25.

The skirt unit 25 may be connected to the peripheral portion (circumferential portion) of the main disk 7. The skirt unit 25 may have a flat surface 25a substantially parallel to a direction of the gas flow, and a curved surface 25b connected to the flat surface 25a and curved in a direction of the gas exhaust channel 29b of the gas collector unit 29. The gas collector unit 29 may include the lower collectors 29a and 29d, the gas exhaust channel 29b, and the upper collector 29c. The lower collectors 29a and 29d and the gas exhaust channel 29b may be disposed under the surface of the main disk 7.

Figure 4:
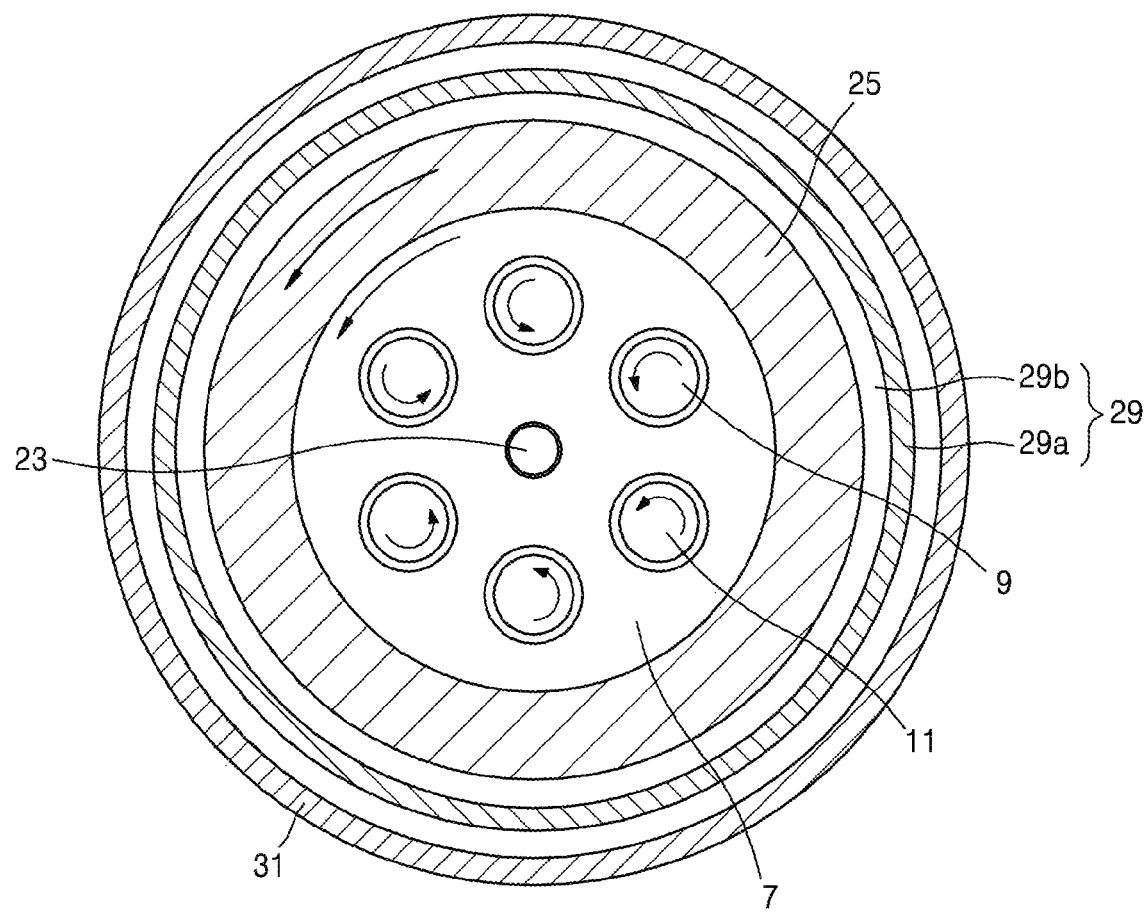
FIG. 4 is a plan view for describing the CVD apparatus of FIG. 1.

FIG. 4 is a plan view for describing the CVD apparatus 100 of FIG. 1. Specifically, in the CVD apparatus 100 of FIG. 1, the main disk 7 may be disposed in the central portion of the chamber 1 of FIG. 1. The main disk 7 may be annular. As described above, the main disk 7 may be configured to be rotated around the rotational axis 20 of FIG. 1 disposed at the support 19. The gas supply unit 23 may be disposed in the central portion of the main disk 7.

The satellite disks 9, on which the substrate 11 is mountable, may be disposed in the main disk 7. The satellite disks 9 may be disposed to circularly surround the center of the chamber 1 of FIG. 1 or the center of the main disk 7. Two or more satellite disks 9 may be provided, and the substrates 11 may be mounted on the satellite disks 9, respectively. The satellite disk 9 may be annular. The satellite disk 9 may be supported to rotate around the rotational axis 12 of FIG. 1. Accordingly, the substrates 11, which are mounted on the satellite disks 9 within the main disk 7, may be rotated around the rotational axes 12 and 20.

The skirt unit 25 may be connected to the peripheral portion (circumferential portion) of the main disk 7. Similar to the main disk 7, the skirt unit 25 may be provided in an annular shape in the peripheral portion of the annular main disk 7. The skirt unit 25 may be rotated together with the main disk 7 when the main disk 7 is rotated. The gas collector unit 29 may be installed in the peripheral portion of the skirt unit 25. The gas collector unit 29 may include the lower collector 29a and the gas exhaust channel 29b. Similar to the main disk 7 and the skirt unit 25, the gas collector unit 29 may be annular.

In particular, similar to the skirt unit 25, the gas exhaust channel 29b may be provided in an annular shape in the peripheral portion of the annular skirt unit 25. The gas exhaust channel 29b may be an exhaust line having not a single hole but a continuous hole. The gas exhaust channel 29b may correspond to the gap G1 of FIG. 1. Accordingly, since the skirt unit 25 is rotated together when the main disk 7 is rotated, it is possible to easily remove parasitic deposition materials deposited around the gas exhaust channel 29b by a frictional force acting with respect to the skirt unit 25. As described above, the housing 31 is configured to protect the chamber 1 of FIG. 1.

Figure 5:
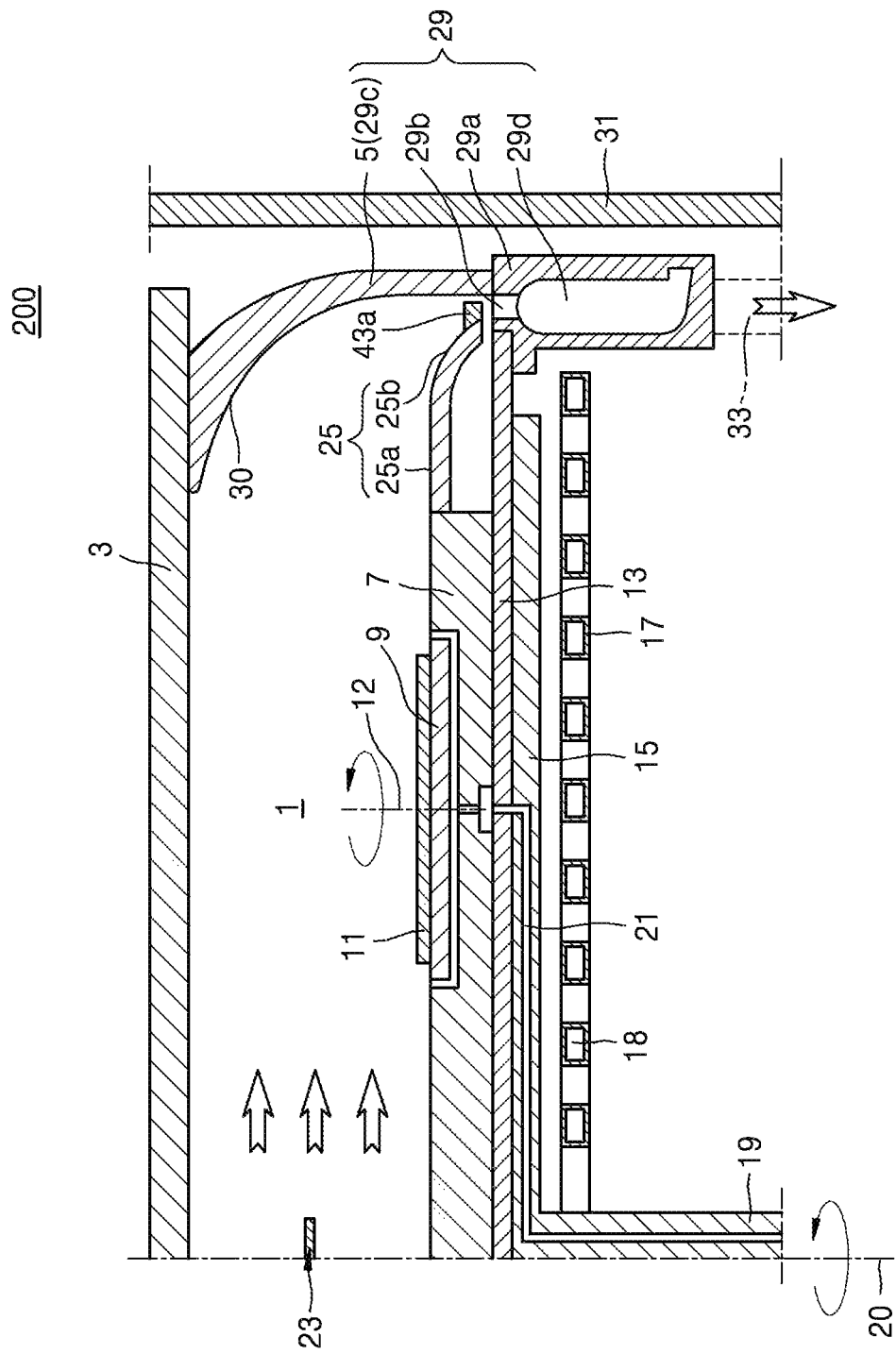
FIGS. 5 to 7 are partial cross-sectional views of CVD apparatuses for manufacturing an LED device, according to some embodiments.
Figure 6:
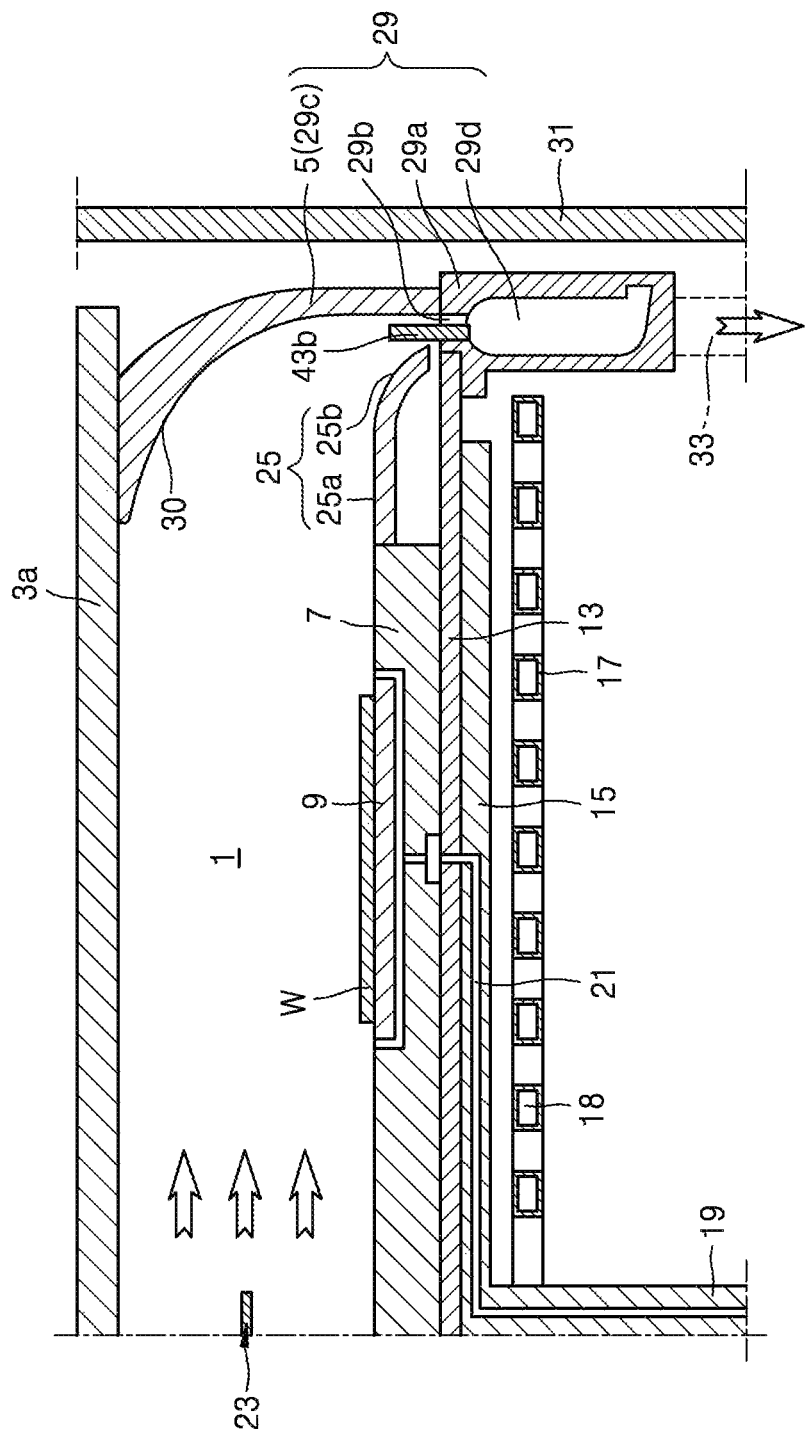
Figure 7:
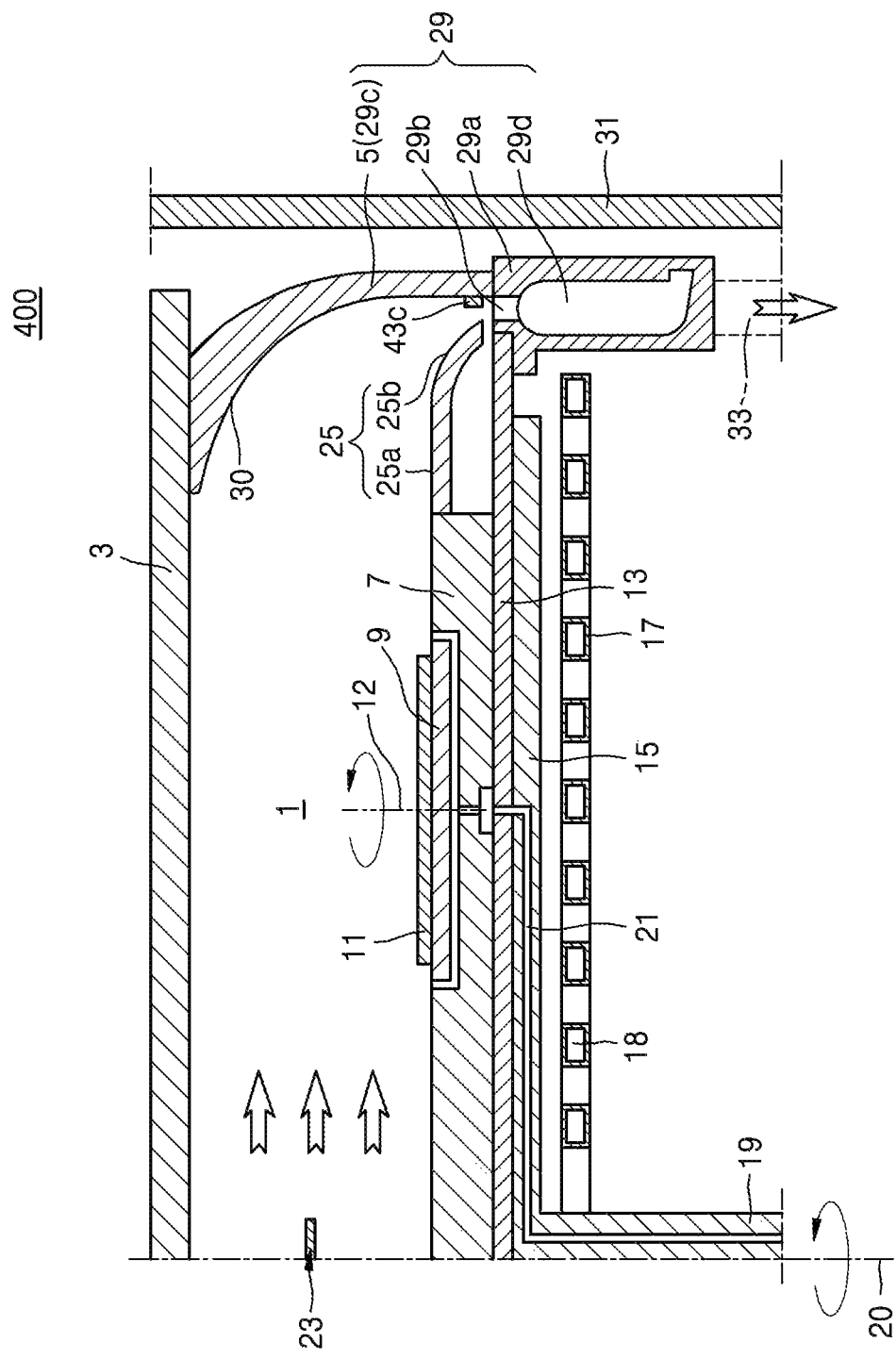
Figure 8:
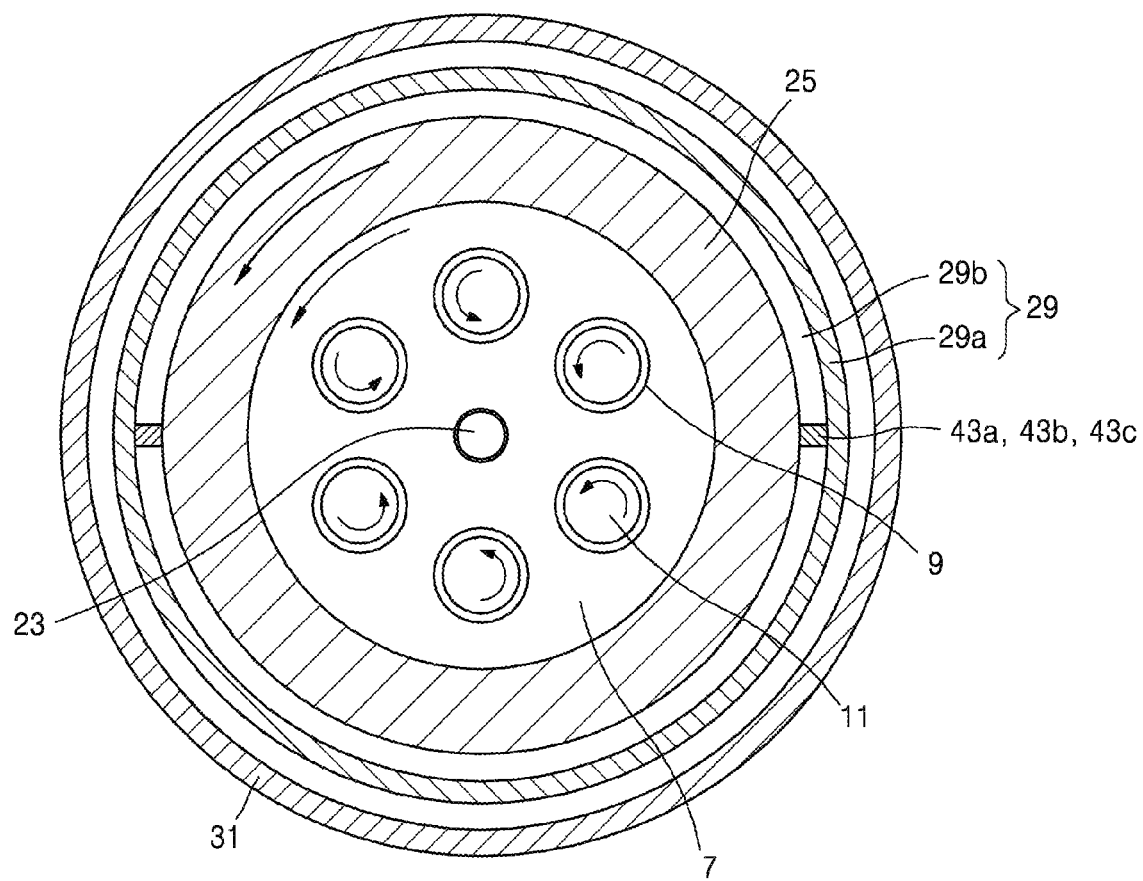
FIG. 8 is a plan view for describing the CVD apparatuses of FIGS. 5 to 7.

FIGS. 5 to 7 are partial cross-sectional views of a CVD apparatus 200, according to some embodiments, and FIG. 8 is a plan view for describing the CVD apparatuses of FIGS. 5 to 7.

Specifically, the CVD apparatuses 200, 300, and 400 of FIGS. 5 to 7 are substantially similar to the CVD apparatus 100 of FIG. 1, except for protrusion members 43a, 43b, and 43c. The plan view of the CVD apparatuses 200, 300, and 400 in FIG. 8 is substantially similar to the plan view of the CVD apparatus in FIG. 4, except for the protrusion member 43a, 43b, and 43c. Therefore, the descriptions provided above with reference to FIGS. 1 to 4 are briefly provided or omitted for brevity. Specifically, the CVD apparatuses 200, 300, and 400 of FIGS. 5 to 7 include the protrusion members 43a, 43b, and 43c, respectively, so as to remove parasitic deposition materials deposited on a skirt unit 25 or an upper collector 29c during the rotation of a main disk 7 and the skirt unit 25.

In the CVD apparatus 200 of FIG. 5, the protrusion member 43a may be installed at one end of the skirt unit 25 that is adjacent to the gas exhaust channel 29b. The protrusion member 43a may be configured to remove parasitic deposition materials deposited on the upper collector 29c during the rotation of the skirt unit 25.

In the CVD apparatus 300 of FIG. 6, the protrusion member 43b may be installed on the lower collector 29a that is adjacent to the gas exhaust channel 29b. In the CVD apparatus 400 of FIG. 7, the protrusion member 43c may be installed on the upper collector 29c that is adjacent to the gas exhaust channel 29b. The protrusion members 43b and 43c may be configured to remove parasitic deposition materials deposited on the skirt unit 25 during the rotation of the skirt unit 25.

In the plan view of the CVD apparatuses 200, 300, and 400 in FIG. 8, the protrusion members 43a, 43b, and 43b installed adjacent to the annular gas exhaust channel 29b are illustrated. The protrusion members 43a, 43b, and 43b are illustrated in FIG. 8 as completely filling some portions of the gas exhaust channel 29b. As described above, the protrusion members 43a, 43b, and 43c installed adjacent to the gas exhaust channel 29b may be configured to remove parasitic deposition materials deposited on the upper collector 29c or the skirt unit 25 during the rotation of the skirt unit 25.

Figure 9:
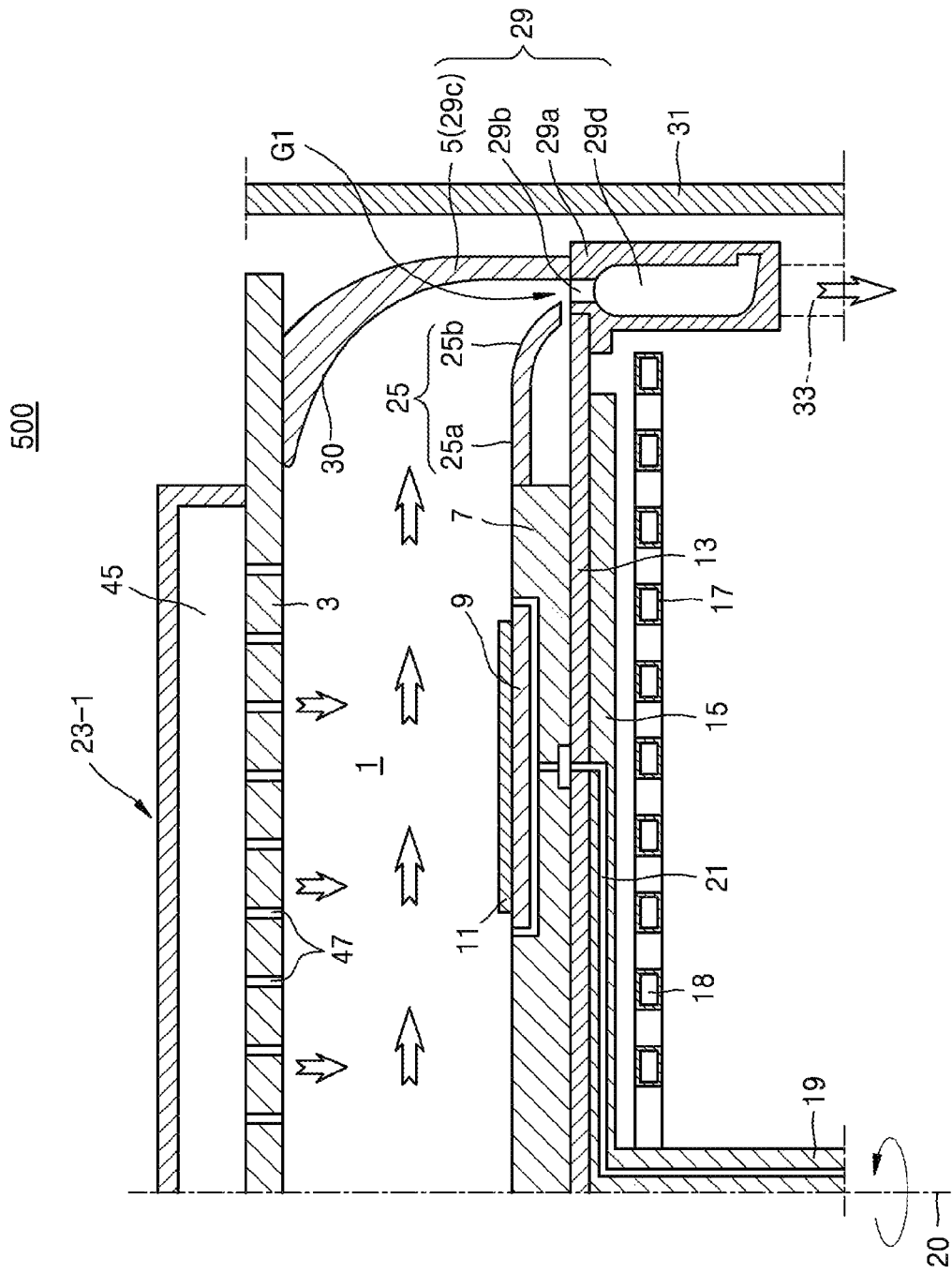
FIG. 9 is a partial cross-sectional view of a CVD apparatus for manufacturing an LED device, according to some embodiments.

FIG. 9 is a partial cross-sectional view of a CVD apparatus 500 for manufacturing an LED device, according to some embodiments. Specifically, the CVD apparatus 500 of FIG. 9 is substantially similar to the CVD apparatus 100 of FIG. 1, except for a gas supply unit 23-1. Therefore, the description provided above with reference to FIG. 1 is briefly provided may be omitted.

The CVD apparatus 500 includes the vertical gas supply unit 23-1 configured to supply a process gas from an upper portion to a lower portion of a chamber 1. The vertical gas supply unit 23-1 may be a shower head. The vertical gas supply unit 23-1 may include a gas distribution unit 45 having a predetermined space on the chamber 1, and a gas exhaust port 47 connected to the gas distribution unit 45 and installed in a ceiling 3 of the chamber 1.

A process gas is introduced into the chamber 1 through the vertical gas supply unit 23-1, and the introduced process gas is exhausted through a gas exhaust channel 29b of a gas collector unit 29 disposed at one side of the chamber 1. As described above, when the process gas is exhausted through the gas collector unit 29, the flow of the process gas may be made smoother by using the skirt unit 25 and the process gas may be more easily exhausted by using the gas collector unit 29.

In addition, as described above, when the process gas is exhausted through the gas collector unit 29, the rotation of the skirt unit 25 may make it easier to remove parasitic deposition materials deposited in the gas exhaust channel 29b.

Figure 10:
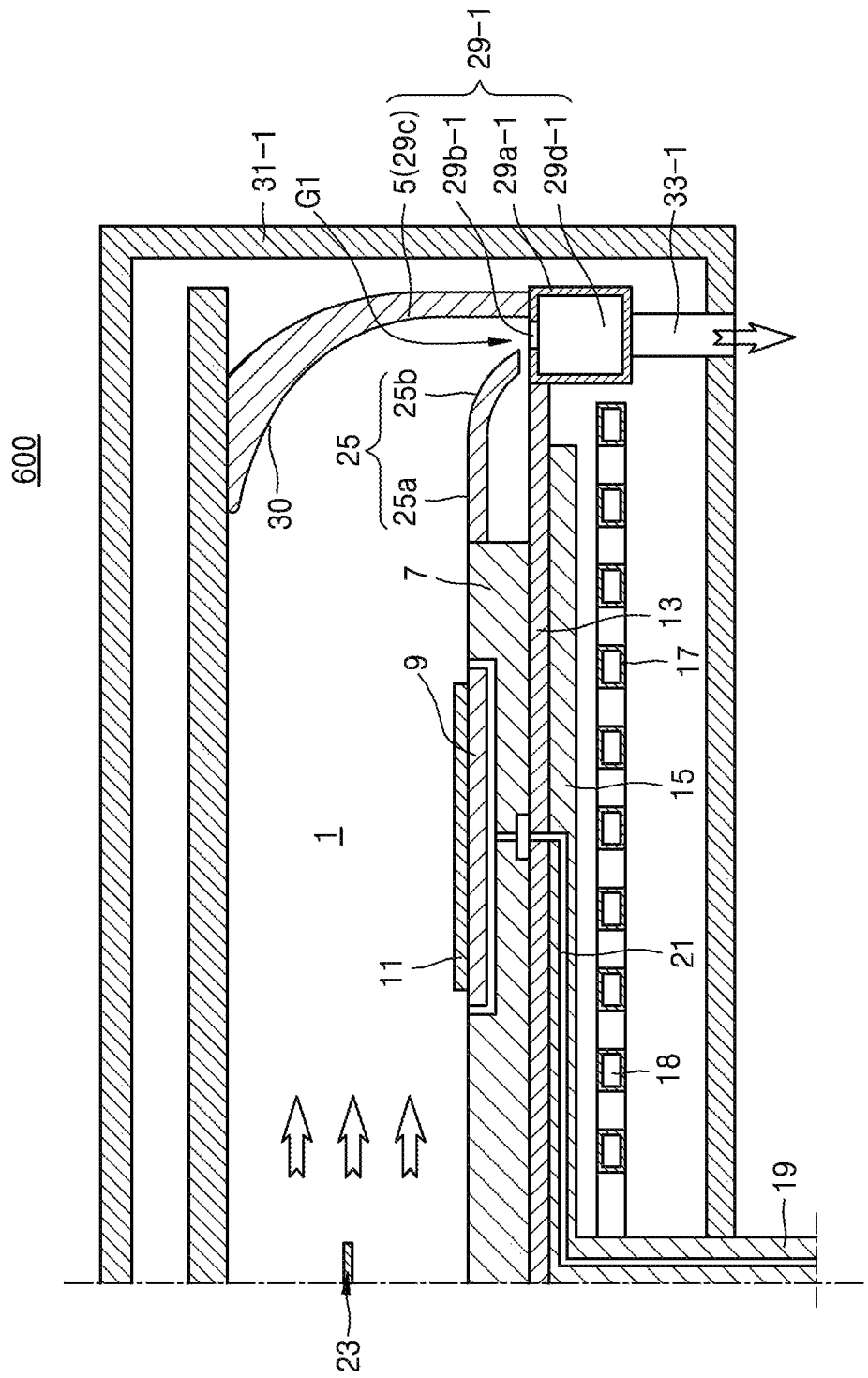
FIG. 10 is a partial cross-sectional view of a CVD apparatus for manufacturing an LED device, according to some embodiments.

FIG. 10 is a partial cross-sectional view of a CVD apparatus 600 for manufacturing an LED device, according to some embodiments. Specifically, the CVD apparatus 600 of FIG. 10 is substantially similar to the CVD apparatus 100 of FIG. 1, except for a gas collector unit 29-1, a housing 31-1, and an exhaust channel 33-1. Therefore, the description provided above with reference to FIG. 1 is briefly provided or omitted.

The CVD apparatus 600 includes the gas collector unit 29-1 having a square shape. The gas collector unit 29-1 may include lower collectors 29a-1 and 29d-1, a gas exhaust channel 29b-1, and an upper collector 29c. The lower collectors 29a-1 and 29d-1 may include a square collector body 29a-1, and a gas collection unit 29d-1 disposed in the square collector body 29a-1. The gas exhaust channel 29b-1 may be disposed in the central portion of the square collector body 29a-1.

A housing 31-1 may be installed to substantially surround the entire chamber 1. The lower collectors 29a-1 and 29d-1 of the gas collector unit 29 may exhaust the process gas to the outside through the exhaust channel 33-1 passing through the housing 31-1.

Figure 11A:
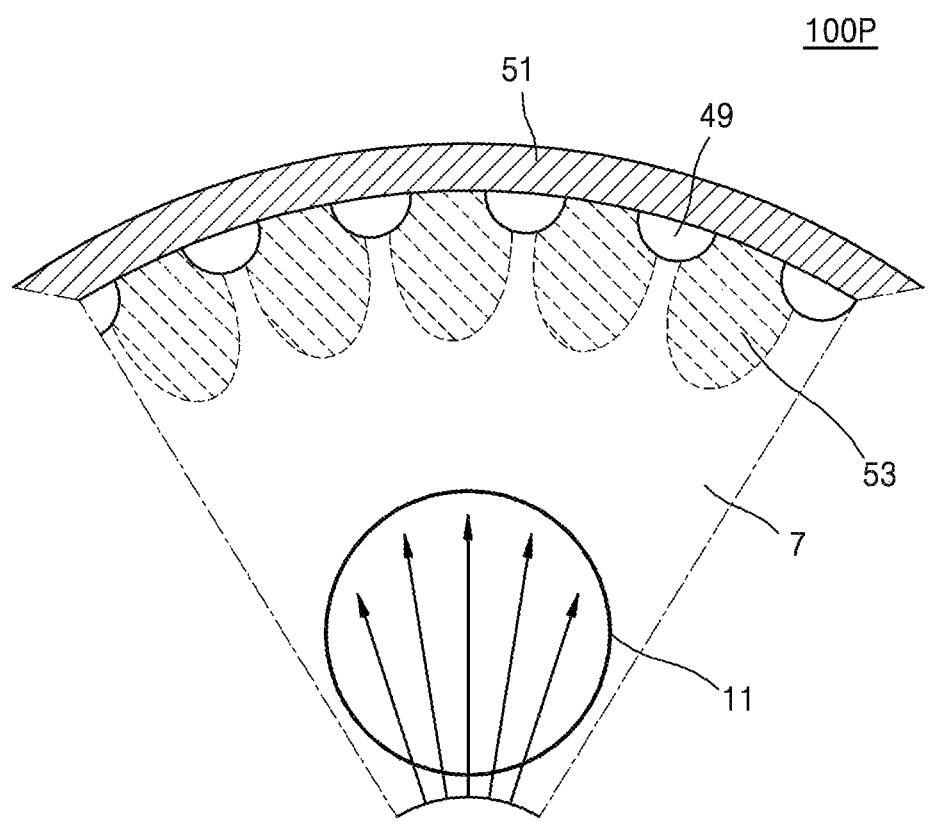
FIGS. 11A and 11B are schematic diagrams for describing the process gas flows of the CVD apparatuses, respectively, according to some embodiments.
Figure 11B:
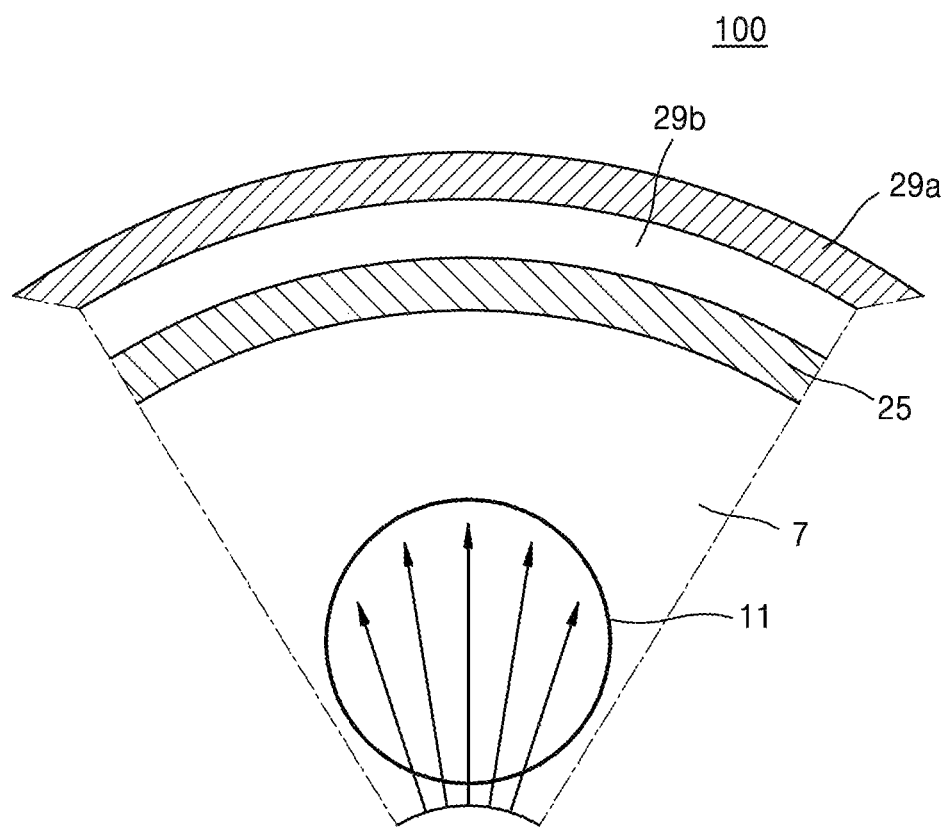

FIGS. 11A and 11B are schematic diagrams for describing the process gas flows of the CVD apparatuses, respectively, according to some embodiments. Specifically, in a CVD apparatus 100p of FIG. 11A according to comparative example, a process gas may flow over a substrate 11 as indicated by arrows. The process gas may be exhausted to the outside through multiple gas exhaust holes 49 disposed between the lower collector 51 and the main disk 7. The gas exhaust holes 49 are discontinuously spaced apart from one another.

In the CVD apparatus 100p according to comparative example, the flow of the process gas is non-uniform and the process gas locally collides against the lower collector 51, causing turbulence 53 between the gas exhaust holes 49. If the turbulence 53 occurs, parasitic deposition materials may be deposited in the chamber 1.

In the CVD apparatus 100 of FIG. 11B, according to this embodiment, a process gas may flow over a substrate 11 as indicated by arrows. The process gas may pass through the skirt unit 25 and be exhausted to the outside through the gas exhaust channel 29b disposed between the lower collector 29a and the main disk 7. The gas exhaust channel 29b may be formed substantially continuously along the peripheral portion of the main disk 7.

In the CVD apparatus 100 according to this embodiment, the flow of the process gas is made uniform due to the skirt unit 25 and the gas exhaust channel 26b. Consequently, in the CVD apparatus 100 according to this embodiment, a reduced amount or no turbulence occurs in the chamber 1, thus preventing parasitic deposition materials from being deposited.

In addition, in the CVD apparatus 100 according to this embodiment, the rotation of the skirt unit 25 makes it possible to remove parasitic deposition materials that may be deposited around the gas exhaust channel 29b.

Hereinafter, a method of manufacturing an LED device package, including a method of manufacturing an LED device by using the CVD apparatus according to one or more of the above-described embodiments will be described briefly.

Figure 12:
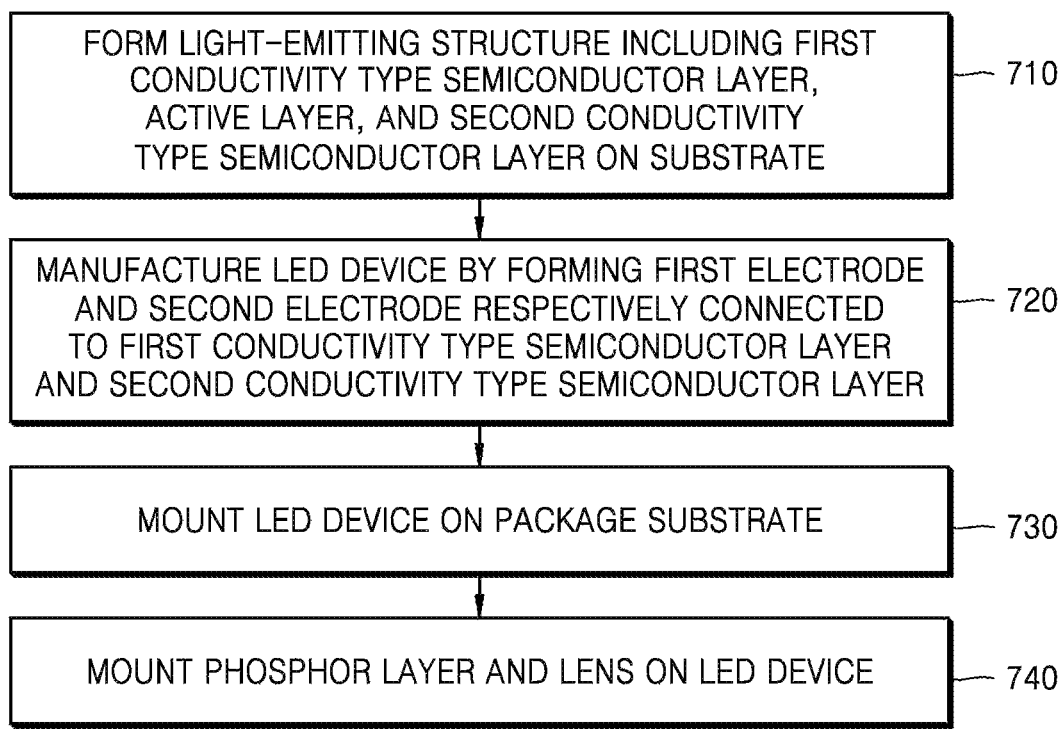
FIG. 12 is a flowchart of a method of manufacturing an LED device using a CVD apparatus, according to an embodiment.

FIG. 12 is a flowchart of a method of manufacturing an LED device package, including a method of manufacturing an LED device by using the CVD apparatus according to an embodiment.

Specifically, the method of manufacturing the LED device package may include: forming a light-emitting structure including a first conductivity type semiconductor layer, an active layer, and a second conductivity type semiconductor layer on a substrate (such as substrate 11 in FIG. 1) (operation 710); and manufacturing an LED device (such as an LED chip) by forming a first electrode and a second electrode respectively connected to the first conductivity type semiconductor layer and the second conductivity type semiconductor layer (operation 720). Methods of manufacturing an LED device according to various embodiments will be described below in detail.

In addition, the method of manufacturing the LED device package may further include: mounting the LED device (such as an LED chip) on a package substrate (operation 730); and mounting a phosphor layer and a lens on the LED device (LED chip) (operation 740). The operation 730 of mounting the LED device (LED chip) and the operation 740 of mounting the phosphor layer and the lens will be described below in detail.

Figure 13:
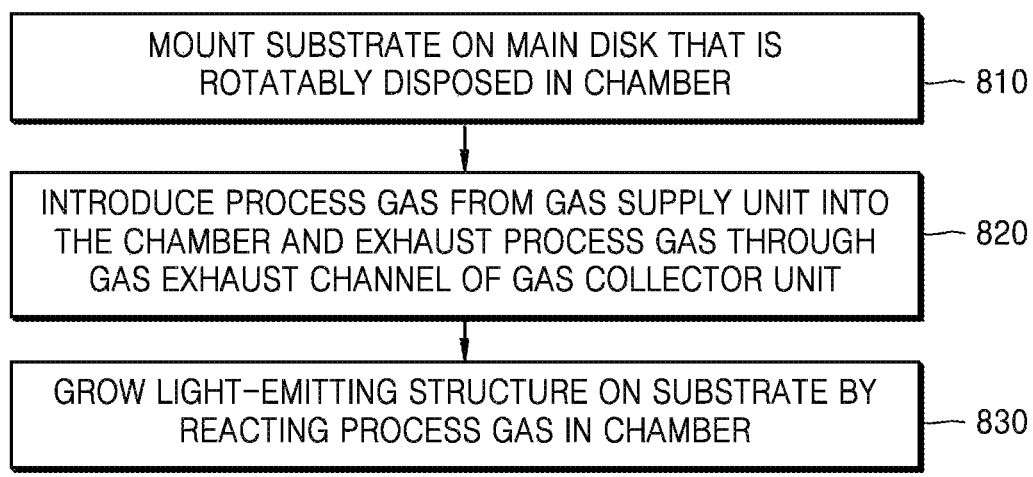
FIG. 13 is a flowchart for describing an operation of forming a light-emitting structure of FIG. 12.

FIG. 13 is a flowchart for describing the operation 710 of forming the light-emitting structure of FIG. 12. Specifically, the operation 710 of forming the light-emitting structure in FIG. 12 may be performed by using any one of the CVD apparatuses 100 to 600 of FIGS. 1, 5 to 7, 9, and 10 or other CVD apparatuses according to other embodiments. Accordingly, the reference numerals described below are the same as those of the previously suggested drawings.

The operation 710 of forming the light-emitting structure may include mounting the substrate 11 on the main disk 7 that is rotatably disposed in the chamber 1 (operation 810). The substrate 11 may be mounted on the satellite disk 9 disposed in the main disk 7. Multiple rotatable satellite disks 9 may be installed in the main disk 7. Substrates 11 may be respectively mounted on the satellite disks 9.

The operation 710 of forming the light-emitting structure may include introducing the process gas from the gas supply unit 23 to the substrate 11 loaded into the chamber 1 and exhausting the process gas through the gas exhaust channel 29b of the gas collector unit 29 (operation 820). When the process gas is introduced, an organic metal gas, a carrier gas, and a hydride gas may be introduced into the chamber 1. The process gas, which is introduced into the chamber 1, may more smoothly flow through the skirt unit 25 provided in the peripheral portion of the main disk 7. The process gas may be exhausted to the gas exhaust channel 29b of the gas collector unit 29 that may be separate from the main disk 7 and may be vertically lower than the main disk 7.

When the process gas is introduced and exhausted, the skirt unit 25 having the curved surface 25b curved in a direction of the gas exhaust channel 29b may prevent turbulence of the process gas flowing from the gas supply unit 23 to the gas collector unit 29. When the process gas is introduced and exhausted, the sidewall 5 of the chamber 1 having the curved wall 30 on the skirt unit 25 may prevent turbulence of the process gas flowing from the gas supply unit 23 to the gas collector unit 29.

When the process gas is introduced and exhausted, the skirt unit 25 may be rotated to remove parasitic deposition materials deposited between the main disk 7 and the gas collector unit 29. When the process gas is introduced and exhausted, the gas exhaust channel 29b of the gas collector unit 29 may be disposed under the gap between the sidewall 5 and the skirt unit 25 of the chamber 1. The main disk 7 and the skirt unit 25 may be annular, and the gas exhaust channel 29b of the gas collector unit 29 may be provided in an annular shape in the peripheral portion of the annular skirt unit 25.

The gas collector unit 29 may include the lower collector 29a, the upper collector 29c corresponding to the sidewall 5 of the chamber 1, and the gas exhaust channel 29b disposed above the lower collector 29a. Protrusion members may be further formed on the skirt unit 25, the lower collector 29a, or the upper collector 29c. When the process gas is introduced and exhausted, the protrusion members 43a, 43b, and 43c may remove parasitic deposition materials deposited on the skirt unit 25 or the upper collector 29c adjacent to the gas exhaust channel 29b during the rotation of the skirt unit 25.

The operation 710 of forming the light-emitting structure may include growing the light-emitting structure on the substrate 11 by reacting the process gas in the chamber 1 (operation 830).

Hereinafter, an LED device, an LED device package, a lighting apparatus, and a light-emitting apparatus, which are manufactured using any one of the CVD apparatuses 100 to 600 or other CVD apparatuses according to various embodiments, will be described. In the following description, the terms "upper portion", "top surface", "lower portion", "bottom surface", and "side surface" are based on the drawing and may be changed according to an actual arranging direction of the LED device.

Figure 14:
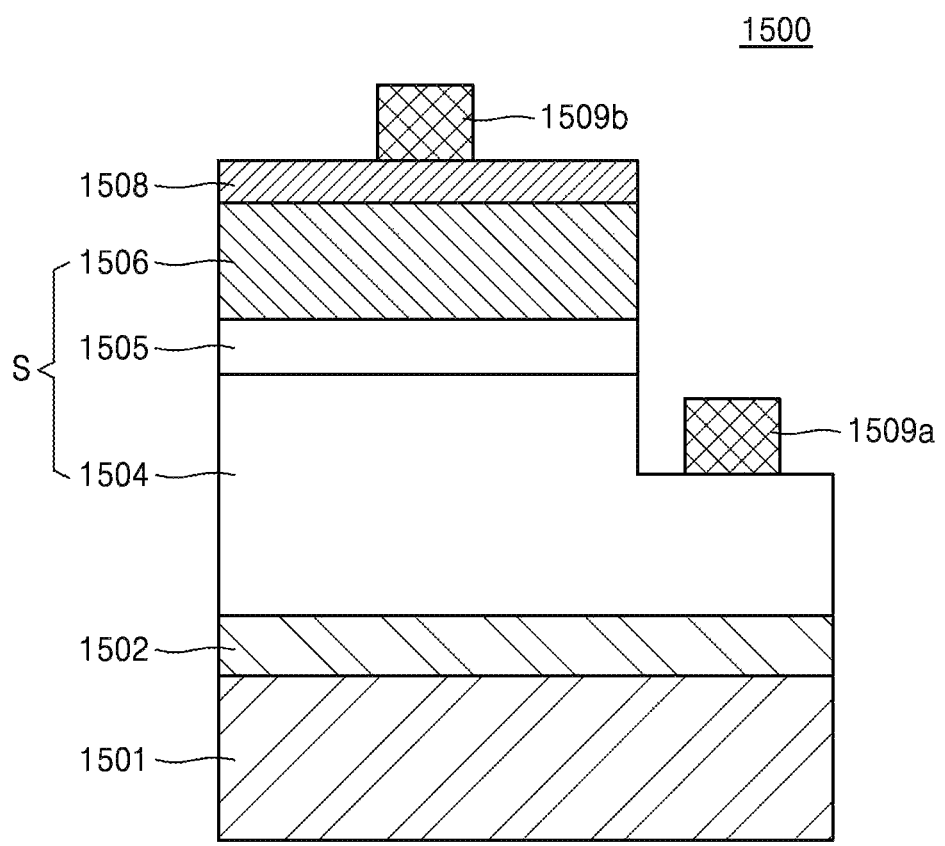
FIG. 14 is a side sectional view of an example of an LED device manufactured using a CVD apparatus, according to an embodiment.

FIG. 14 is a side sectional view of an example of an LED device manufactured using the CVD apparatus according to an embodiment. Specifically, a chip 1500 includes a light-emitting structure S formed on a buffer layer 1502 of a substrate 1501 (for example, substrate 11 in FIG. 1). The light-emitting structure S may be manufactured using any one of the above-described CVD apparatuses 100 to 600 or other CVD apparatuses according to various embodiments. The buffer layer 1502 also may be manufactured using any one of the above-described CVD apparatuses 100 to 600 or other CVD apparatuses according to various embodiments.

The light-emitting structure S may include a first conductivity type semiconductor layer 1504, an active layer 1505, and a second conductivity type semiconductor layer 1506. An ohmic contact layer 1508 may be formed on the second conductivity type semiconductor layer 1506. The ohmic contact layer 1508 also may be manufactured using any one of the above-described CVD apparatuses 100 to 600 or other CVD apparatuses according to various embodiments. First and second electrodes 1509a and 1509b are formed on the top surfaces of the first conductivity type semiconductor layer 1504 and the ohmic contact layer 1508, respectively.

Hereinafter, main elements of the LED device (such as an LED chip) 1500 will be described in more detail. As the substrate 1501, when necessary, an insulating substrate, a conductive substrate, or a semiconductor substrate may be used. Examples of the substrate 1501 may include a sapphire substrate, a SiC substrate, an MgAl2O4 substrate, a MgO substrate, a LiAlO2 substrate, and a LiGaO2 substrate. As a heterogeneous substrate, a sapphire substrate, a SiC substrate, or a Si substrate may be mainly used. When using the heterogeneous substrate, defects such as dislocation may be increased by a difference of a lattice constant between a material of a substrate and a material of a thin film. In addition, when a temperature changes, warpage may occur due to a difference of a thermal expansion coefficient between the material of the substrate and the material of the thin film, and the warpage may cause cracks in the thin film. Such problems may be reduced using the buffer layer 1502 between the substrate 1501 and the GaN-based light-emitting structure S.

The buffer layer 1502 may include $Al_xIn_yGa_{(1-x-y)}N$ ($0 \leq x \leq 1$, $0 \leq y \leq 1$), such as GaN, AlN, AlGaN, InGaN, or InGaNAlN, and may include $ZrB_2$, $HfB_2$, ZrN, HfN, or TiN. In addition, multiple layers may be combined or a composition may be gradually changed in use.

The first conductivity type semiconductor layer 1504 and the second conductivity type semiconductor layer 1506 may have a single-layer structure, but may have multilayer structures with different compositions or thicknesses. For example, the first conductivity type semiconductor layer 1504 and the second conductivity type semiconductor layer 1506 may include carrier injection layers, respectively, which are capable of improving hole injection efficiency and electron injection efficiency. In addition, the first conductivity type semiconductor layer 1504 and the second conductivity type semiconductor layer 1506 may have various superlattice structures.

The first conductivity type semiconductor layer 1504 may further include a current diffusion layer (not illustrated) in a region adjacent to the active layer 1505. The current diffusion layer may have a structure multiple $In_xAl_yGa_{(1-x-y)}N$ layers having different compositions or different impurity content are repeatedly stacked, or may include an insulating material layer in part.

The second conductivity type semiconductor layer 1506 may further include an electron blocking layer (not illustrated) in a region adjacent to the active layer 1505. The electron blocking layer may have a stack structure of $In_xAl_yGa_{(1-x-y)}N$ with different compositions or at least one $Al_yGa_{(1-y)}N$ layer. Since the electronic blocking layer has a greater band gap than the active layer 1505, the electron blocking layer prevents electrons from going over the second conductivity type (p-type) semiconductor layer 1506.

As described above, the light-emitting structure S may be formed by supplying a process gas, such as an organic metal gas (for example, TMGa or TMAl) and a nitrogen-containing gas (for example, ammonia gas) as a hydride gas, to the chamber (for example, chamber 1 in FIG. 1) into which the substrate 1501 (for example, substrate 11 in FIG. 1) is loaded, maintaining a temperature of the substrate 1501 in the range of about 900° C. to about 1,100° C., and growing a GaN-based compound semiconductor on the substrate 1501. The light-emitting structure S may be formed by laminating undoped, n-type, or p-type GaN-based compound semiconductors, when necessary, by further supplying impurities to the chamber. Si may be used as n-type impurities. Zn, Cd, Be, Mg, Ca, or Ba may be used as p-type impurities, and Mg or Zn may be usually used as the p-type impurities. Although particular impurities have been given as examples, other impurities may be used.

The active layer 1505, which is disposed between the first conductivity type semiconductor layer 1504 and the second conductivity type semiconductor layer 1506, may have a multi quantum well (MQW) structure in which a quantum well layer and a quantum barrier layer are alternately stacked. For example, in the case of a nitride semiconductor, the active layer 1505 may have a GaN/InGaN structure. In addition, the active layer 1505 may has a single quantum well (SQW) structure.

The ohmic contact layer 1508 may reduce an ohmic contact resistance by relatively increasing an impurity concentration, thus lowering an operating voltage of the device and improving characteristics of the device. The ohmic contact layer 1508 may include a GaN layer, an InGaN layer, a ZnO layer, a graphene layer, or the like.

The first or second electrode 1509a or 1509b may include a material such as Ag, Ni, Al, Rh, Pd, Ir, Ru, Mg, Zn, Pt, and Au and may include a structure of two or more layers, such as Ni/Ag, Zn/Ag, Ni/Al, Zn/Al, Pd/Ag, Pd/Al, Ir/Ag, Ir/Au, Pt/Ag, Pt/Al, and Ni/Ag/Pt.

As one example, the light-emitting device (such as an LED chip) 1500 may have a structure in which the first and second electrodes 1509a and 1509b face the same surface as the optical extraction surface. Furthermore, the light-emitting device 1500 may have various structures, for example, a flip-chip structure in which the first and second electrodes 1509a and 1509b are arranged in a direction opposite to the optical extraction surface, a vertical structure in which the first electrode 1509a and the second electrode 1509b are formed on opposite surfaces, a horizontal/vertical structure employing an electrode structure by forming multiple vias in the chip so as to increase current dispersion efficiency and heat dissipation efficiency.

Figure 15:
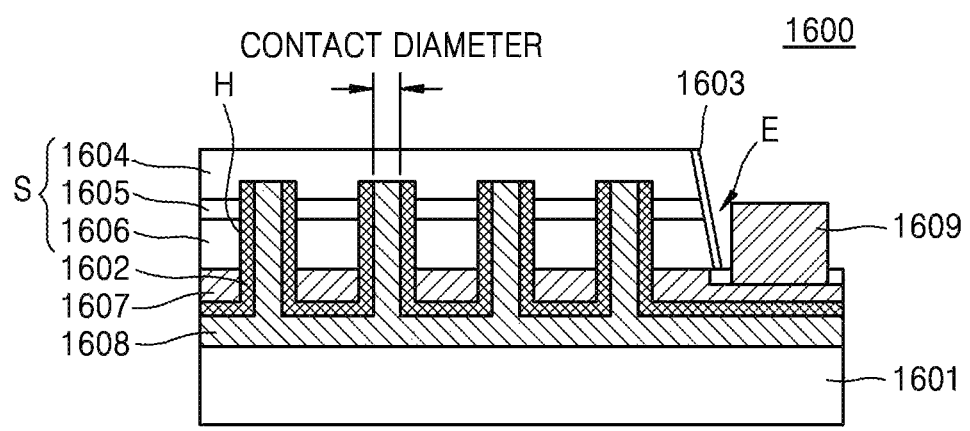
FIG. 15 is a side sectional view of an example of an LED device manufactured using a CVD apparatus, according to an embodiment.

FIG. 15 is a side sectional view of an example of an LED device 1600 manufactured using the CVD apparatus according to an embodiment. Specifically, the LED device (such as an LED chip) 1600 may have a larger-area structure for higher power illumination. The LED device 1600 may have a structure for increasing current dispersion efficiency and heat dissipation efficiency. The LED device 1600 may include a first conductivity type semiconductor layer 1604, an active layer 1605, a second conductivity type semiconductor layer 1606, a second electrode layer 1607, an insulating layer 1602, a first electrode layer 1608, and a substrate 1601, which are sequentially stacked.

The first conductivity type semiconductor layer 1604, the active layer 1605, and the second conductivity type semiconductor layer 1606 may constitute a light-emitting structure S, and the light-emitting structure S may be manufactured using any one of the above-described CVD apparatuses 100 to 600 or other CVD apparatuses according to various embodiments.

The first electrode layer 1608 may include at least one contact hole H that is electrically insulated from the second conductivity type semiconductor layer 1606 and the active layer 1605 and extends from one surface of the first electrode layer 1608 to at least a portion of the first conductivity type semiconductor layer 1604, so as to be electrically connected to the first conductivity type semiconductor layer 1604. In some embodiments, the first electrode layer 1608 may be omitted.

The contact hole H extends from the interface of the first electrode layer 1608 to the inside of the first conductivity type semiconductor layer 1604 through the second electrode layer 1607, the second conductivity type semiconductor layer 1606, and the active layer 1605. The contact hole H may extend to the interface of at least the active layer 1605 and the first conductivity type semiconductor layer 1604. Alternatively, the contact hole H may extend to a portion of the first conductivity type semiconductor layer 1604. Since the contact hole H is provided for current dispersion and electrical connection of the first conductivity type semiconductor layer 1604, the object of the contact hole H is achieved as long as the contact hole H contacts the first conductivity type semiconductor layer 1604. Thus, the contact hole H may, but need not extend to the outer surface of the first conductivity type semiconductor layer 1604.

The second electrode layer 1607, which is formed on the second conductivity type semiconductor layer 1606, may include a material such as silver (Ag), nickel (Ni), aluminium (Al), rhodium (Rh), palladium (Pd), iridium (Ir), rubidium (Ru), magnesium (Mg), zinc (Zn), platinum (Pt), and gold (Au). The selection of the material may depend on the light reflection function, the function of the second conductivity type semiconductor layer 1606, and the ohmic contact function. The second electrode layer 1607 may be formed using a sputtering process, a deposition process, or other process.

The contact hole H has a shape passing through the second electrode layer 1607, the second conductivity type semiconductor layer 1606, and the active layer 1605, so as to be connected to the first conductivity type semiconductor layer 1604. The contact hole H may be formed using an etching process, for example, inductively coupled plasma-reactive ion etching (ICP-RIE).

The insulating layer 1602 may be formed to cover the sidewall of the contact hole H and the surface of the second conductivity type semiconductor layer 1606. In this case, at least a portion of the first conductivity type semiconductor layer 1604 corresponding to the bottom of the contact hole H may be exposed. The insulating layer 1602 may be formed by depositing an insulating material such as $SiO_2$, $SiO_xN_y$, or $Si_xN_y$.

The LED device 1600 may include the second electrode layer 1608 including conductive vias that are formed by filling the contact holes H with a conductive material. The substrate 1601 is provided on the second electrode layer 1608. In such a structure, the substrate 1601 may be electrically connected to the conductive via connected to the first conductivity type semiconductor layer 1604.

The substrate 1601 may include, but is not limited to, one or more of Au, Ni, Al, Cu, W, Si, Se, GaAs, SiAl, Ge, SiC, AlN, $Al2O_3$, GaN, and AlGaN and may be formed by a plating process, a sputtering process, a deposition process, an adhering process, or other process.

In order to reduce a contact resistance, the number, a shape, and a pitch of the contact holes H and a contact diameter (or a contact area) between the contact hole H and the first and second conductivity type semiconductor layers 1604 and 1606 may be appropriately adjusted. A current flow may be improved by arranging the contact holes along rows and columns in various forms. In a region in which the conductive vias constituting the rows and the columns (that is, protrusion portions of the second electrode layer 1608) contact the first conductivity type semiconductor layer 1604, the number of the conductive vias and the contact area may be adjusted such that the contact area is in the range of about 0.5% to about 20% with respect to the planar area of the light-emitting structure.

In the region contacting the first conductivity type semiconductor layer 1604, a diameter of the conductive via may be in the range of about 1 μm to about 50 μm, the number of the conductive vias may be 1 to about 48,000 per the region of the light-emitting structure according to the area of the region of the light-emitting structure. The number of the conductive vias may be different according to the area of the region of the light-emitting structure. However, the number of the conductive vias may be two or more, and the conductive vias may be arranged in a matrix form in which a distance between the conductive vias is in the range of about 50 μm to 500 μm. Specifically, the distance between the conductive vias may be in the range of about 100 μm to about 450 μm.

If the distance between the conductive vias is less than 50 μm, the number of the vias may be increased and the light-emitting area is relatively decreased, resulting in a reduction in light emission efficiency. If the distance between the conductive vias is greater than 500 μm, a current diffusion may become difficult and light emission efficiency may be degraded. A depth of the conductive via may be difficult according to a thickness of the second conductivity type semiconductor layer 1606 and a thickness of the active layer 1605. For example, the depth of the conductive via may be in the range of about 0.5 μm to about 5.0 μm. An electrode pad 1609 may be formed on the second electrode layer 1607. The electrode pad 1609 may be insulated by the insulating layer 1602.

A lighting apparatus using the LED device provides improved heat dissipation characteristics. However, in terms of the entire heat dissipation performance, the LED device employed in the lighting apparatus may have a smaller heat value. As an LED device satisfying such requirements, an LED chip including a nano structure (nano light-emitting structure) (hereinafter, referred to as a "nano LED chip") may be used.

In an embodiment, a nano LED chip may include a core/shell type nano LED chip. Since the core/shell type nano LED chip may have a low binding density, a relatively small amount of heat is generated. Since the nano structure may be used, the light-emitting area may be increased and the light emission efficiency. In addition, since a non-polar active layer may be obtained, it is possible to prevent efficiency degradation due to polarization and improve droop characteristics. Hereinafter, an example of the nano LED chip will be described.

Figure 16:
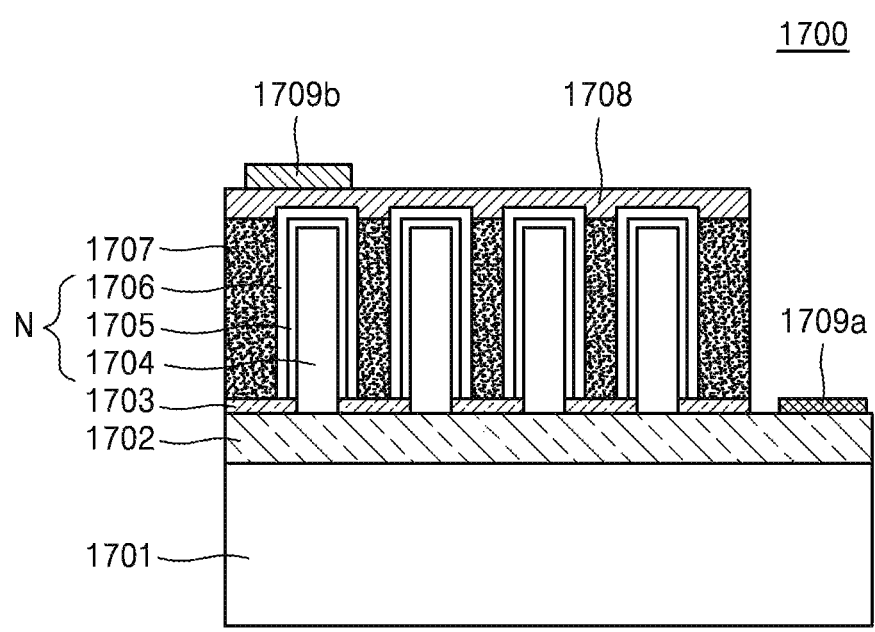
FIG. 16 is a side sectional view of an example of an LED device manufactured using a CVD apparatus, according to an embodiment.

FIG. 16 is a side sectional view of an example of an LED device manufactured using the CVD apparatus according to an embodiment. Specifically, the nano LED chip 1700 may include multiple nano light-emitting structures N on a substrate 1701. The nano light-emitting structures N may have a core/shell rod structure; however, other embodiments are not limited thereto. The nano light-emitting structures N may have various structures such as a pyramid structure.

The nano LED chip 1700 may further include a base layer 1702 on a substrate 1701. The base layer 1702 may be a first conductivity type semiconductor that provides a growth surface for the nano light-emitting structures N. A mask layer 1703 having an open region for growth of the nano light-emitting structures N (in particular, a core) may be formed on the base layer 1702. The mask layer 1703 may be a single layer or a multilayer. The mask layer 1703 may include a dielectric material such as $SiO_2$ or $SiN_x$.

A first conductivity type nano core 1704 may be formed by growing the first conductivity type semiconductor by using the mask layer 1703 having the open region such that the inside of the mask layer 1703 is selectively filled. A portion of the mask layer 1703 may be removed by etching. An active layer 1705 and a second conductivity type semiconductor layer 1706 may be formed on the exposed surface of the nano core 1704 as a shell layer. Accordingly, the nano light-emitting structures N may have a core/shell structure in which the first conductivity type semiconductor serves as a nano core, and the active layer 1705 and the second conductivity type semiconductor layer 1706 surrounding the nano core serve as a shell layer.

The nano light-emitting structures N may correspond to the light-emitting structure of one or more of the embodiments described herein. The nano light-emitting structures N may be manufactured using any one of the above-described CVD apparatuses 100 to 600 or other CVD apparatuses according to various embodiments.

The nano LED chip 1700 according to this embodiment may further include a filling material 1707 that is filled between the nano light-emitting structures N. The filling material 1707 may structurally stabilize the nano light-emitting structures N. The filling material 1707 is not limited thereto and may be made of a reflective material or a transparent material such as silicon oxide (SiO2). An ohmic contact layer 1708 surrounding the second conductivity type semiconductor layer 1706 may be formed on the nano light-emitting structures N such that the ohmic contact layer 1708 is connected to the second conductivity type semiconductor layer 1706. The nano LED chip 1700 may include a first electrode 1709a and a second electrode 1709b respectively connected to the base layer 1702 made of the first conductivity type semiconductor and the ohmic contact layer 1708.

Light having two or more different wavelengths may be emitted from a single device by changing a diameter, component, or doping concentration of the nano light-emitting structures N. White light may be implemented by appropriately adjusting light having different wavelengths, without using phosphors in the single device. Light having various desired colors or white light having different color temperatures may be implemented by connecting such a device to other LED chips or connecting wavelength conversion materials such as phosphors.

Figure 17:
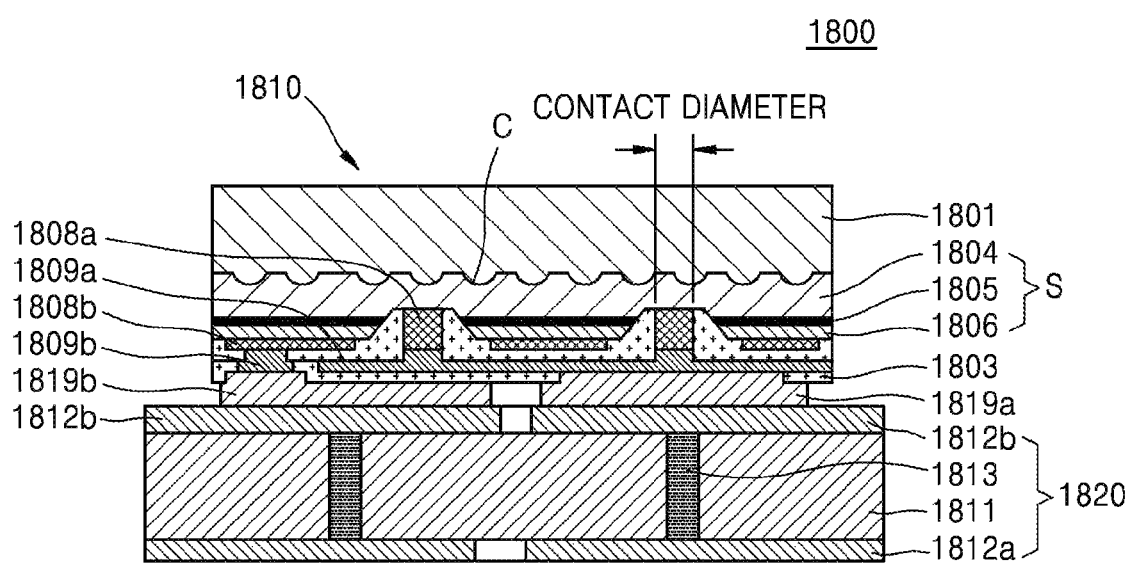
FIG. 17 is a side sectional view of an example of an LED device package in which an LED device manufactured using a CVD apparatus is mounted on a package substrate, according to an embodiment.

FIG. 17 is a side sectional view of an LED device package 1800 in which an LED device 1810 manufactured using a CVD apparatus is mounted on a package substrate 1820, according to an embodiment. Specifically, the LED device package 1800 may include the package substrate 1820 and the LED device (LED chip) 1810 mounted on the package substrate 1820. The LED chip 1810 may be an LED chip different from the above-described example.

The LED chip 1810 may include a light-emitting structure S disposed on one surface of a substrate 1801, and first and second electrodes 1808a and 1808b electrically connected to opposite sides of the light-emitting structure S. In addition, the LED chip 1810 may include an insulating unit 1803 formed to cover the first and second electrodes 1808a and 1808b. The first and second electrodes 1808a and 1808b may include first and second electrode pads 1819a and 1819b by first and second electrical connection units 1809a and 1809b.

The light-emitting structure S may include a first conductivity type semiconductor layer 1804, an active layer 1805, and a second conductivity type semiconductor layer 1806, which are sequentially disposed on the substrate 1801. The light-emitting structure S may be manufactured using any one of the above-described CVD apparatuses 100 to 600.

The first electrode 1808a may be a conductive via that passes through the second conductivity type semiconductor layer 1806 and the active layer 1805 and is connected to the first conductivity type semiconductor layer 1804. The second electrode 1808b may be connected to the second conductivity type semiconductor layer 1806.

The insulating unit 1803 may include an opening region exposing at least a portion of the first and second electrodes 1808a and 1808b, and the first and second electrode pads 1819a and 1819b may be connected to the first and second electrodes 1808a and 1808b, respectively. The first and second electrodes 1808a and 1808b may have a structure with a single-layer or a multilayer of a conductive material having an ohmic characteristic with respect to the first and second conductivity type semiconductor layers 1804 and 1806. For example, the first and second electrodes 1808a and 1808b may be formed by a process of depositing or sputtering at least one selected from the group consisting of Ag, Al, Ni, Cr, and transparent conductive oxide (TCO). The first and second electrodes 1808a and 1808b may be disposed in the same direction. As described below, the first and second electrodes 1808a and 1808b may be mounted on a lead frame or the like in a so-called flip-chip form. In this case, the first and second electrodes 1808a and 1808b may be disposed to face the same direction.

In particular, the first electrical connection unit 1809a may be formed by the first electrode 1808a having a conductive via that passes through the first conductivity type semiconductor layer 1804 and the active layer 1805 and is connected to the first conductivity type semiconductor layer 1804 in the light-emitting structure S.

In order to reduce a contact resistance, the number, shapes, and pitches of the conductive via and the first electrical connection unit 1809a and a contact diameter (or a contact area) with respect to the first conductivity type semiconductor layer 1804 may be appropriately adjusted. A current flow may be improved by arranging the conductive via and the first electrical connection unit 1809a along rows and columns.

An electrode structure of the other side of the light-emitting structure S may include the second electrode 1808b directly formed on the second conductivity type semiconductor layer 1806, and the second electrical connection unit 1809b formed on the second electrode 1808b. The second electrode 1808b may form an electrical ohmic contact with the second conductivity type semiconductor layer 1806. In addition, since the second electrode 1808b may be made of a light reflection material, the second electrode 1808b may effectively emit light generated in the active layer 1805 toward the substrate 1801 in a state where the LED chip 1810 is mounted in a flip-chip structure. The second electrode 1808b may include a light transmitting conductive material such as TCO, depending on a main light-emitting direction.

The two electrode structures described above may be electrically separated from each other by the insulating unit 1803. Any material may be used in the insulating unit 1803 as long as the material has an electrically insulating characteristic. Although any material having an electrically insulating characteristic may be used for the insulating unit 1803, in some embodiments the material may have a low light absorption rate. For example, silicon oxide or silicon nitride, such as $SiO_2$, $SiO_xN_y$, or $Si_xN_y$, may be used. In some embodiments, a light reflection structure may be formed by dispersing a light reflective filler in the light transmitting material.

The first and second electrode pads 1819a and 1819b may be respectively connected to the first and second electrical connection units 1809a and 1809b and function as external terminals of the LED chip 1810. For example, the first and second electrode pads 1819a and 1819b may include Au, Ag, Al, Ti, W, Cu, Sn, Ni, Pt, Cr, NiSn, TiW, AuSn, or eutectic metal thereof. In this case, since the first and second electrode pads 1819a and 1819b may be bonded using the eutectic metal at the time of mounting on the package substrate 1820, separate solder bumps generally used at the time of flip-chip bonding may not be used in some embodiments. The mounting method using the eutectic metal may have a superior heat dissipation efficiency as compared with the case of using the solder bumps. In this case, in order to obtain a superior heat dissipation efficiency, the first and second electrode pads 1819a and 1819b may be formed to occupy a larger area.

In some embodiments, the light-emitting structure S may be similar to that described above with reference to FIG. 14. In addition, although not specifically illustrated, a buffer layer (not illustrated) may be formed between the light-emitting structure S and the substrate 1801. The buffer layer may be provided with an undoped semiconductor layer made of nitride and may reduce lattice defects of the light-emitting structure grown thereon.

The substrate 1801 may have first and second peripheral surfaces opposite to each other, and an uneven structure may be formed on at least one of the first and second peripheral surfaces of the substrate 1801. The uneven structure formed on one surface of the substrate 1801 may be formed by etching a portion of the substrate 1801. Thus, the uneven structure may be made of the same material as the substrate. The uneven structure may be made of a heterogeneous material different from the substrate 1801.

In some embodiments, various paths of light emitted from the active layer 1805 may be provided by forming the uneven structure at the interface between the substrate 1801 and the first conductivity type semiconductor layer 1804. This may reduce a light absorption rate in the semiconductor layer and increase a light scattering rate, thus improving light extraction efficiency.

Specifically, the uneven structure may be formed to have a regular or irregular shape. The heterogeneous material of the uneven structure may include a transparent conductor, a transparent insulator, or a reflective material having a higher reflectivity. Examples of the transparent insulator may include $SiO_2$, $SiN_x$, $Al_2O_3$, HfO, $TiO_2$, and ZrO. Examples of the transparent conductor may include TCO, such as zinc oxide and indium oxide containing an additive (Mg, Ag, Zn, Sc, Hf, Zr, Te, Se, Ta, W, Nb, Cu, Si, Ni, Co, Mo, Cr, or Sn). Examples of the reflective material may include Ag, Al, or multilayer films having different refractive indices. However, other embodiments are not limited thereto.

The substrate 1801 may be removed from the first conductivity type semiconductor layer 1804. The removal of the substrate 1801 may be performed using a laser lift-off (LLO) process using a laser, an etching process, or a polishing process. In addition, after the substrate 1801 is removed, the surface of the first conductivity type semiconductor layer 1804 may be made uneven.

As illustrated, the LED chip 1810 may be mounted on the package substrate 1820. The package substrate 1820 may include upper and lower electrode layers 1812b and 1812a respectively formed on the top and bottom surfaces of a substrate body 1811, and a via 1813 passing through the substrate body 1811 and connected to the upper and lower electrode layers 1812b and 1812a. The substrate body 1811 may include a resin, a ceramic, or a metal, and the upper or lower electrode layer 1812b and 1812a may be a metal layer including Au, Cu, Ag, or Al.

The substrate, on which the LED chip 1810 is mounted, is not limited to the package substrate 1820 illustrated in FIG. 17. Any type of a substrate may be use as long as a wiring structure for driving the LED chip 1810 or other similar structure is formed on the substrate. For example, the LED chip may be mounted on a package body having a pair of lead frames.

In addition to the above-described LED chip, LED chips having various structures may be used. For example, an LED chip, which has high light extraction efficiency from forming surface-plasmon polaritions (SPP) at a metal-dielectric interface and interacting a quantum well with exciton, may be used.

LED chips having various shapes may be mounted as bare chips on a circuit board and be used as the above-described LED device array. On the other hand, package structures having various shapes, which are mounted on the package body having a pair of electrode structure, may be used.

A package including such an LED device (such as an LED chip) (hereinafter, referred to as an LED device package) may provide an external terminal structure that facilitate connection to an external circuit, and may have a heat dissipation structure for improving heat dissipation characteristics of the LED chip and various optical structures for improving optical characteristics. Examples of the optical structures may include a wavelength conversion unit that converts light emitted from the LED chip into light having different wavelengths, and a lens structure that improves light distribution characteristics.

As an example of the LED device package that may be used in the above-described lighting apparatus, an LED chip package having a chip scale package (CSP) may be used. Since the CSP may reduce the size of the LED chip package and simplifies a manufacturing process, the CSP is suitable for mass production. In addition, since a wave conversion material such as phosphors and an optical structure such as a lens may be integrally formed with the LED chip, the CSP may be suitably used in the lighting apparatus.

Figure 18:
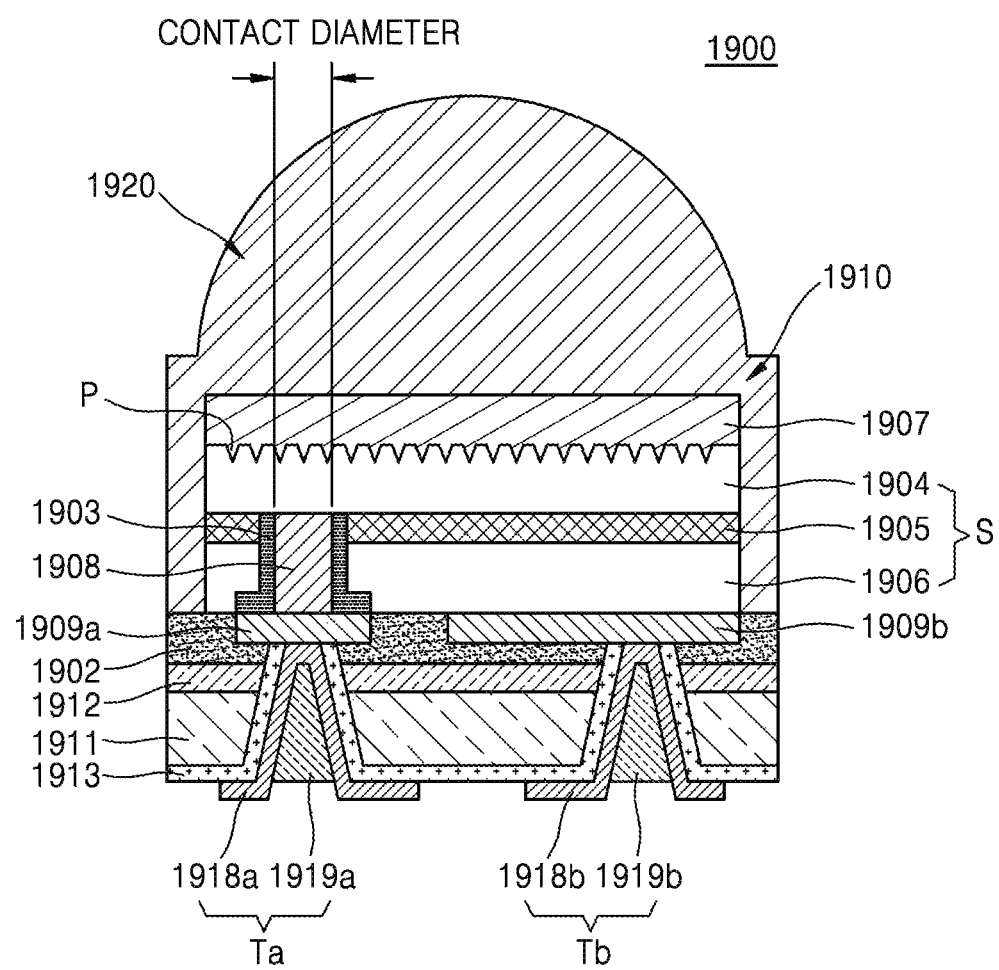
FIG. 18 is a side sectional view of an example of an LED device package that is usable for an LED device array in which an LED device manufactured using a CVD apparatus is arranged, according to an embodiment.

FIG. 18 is a side sectional view of an example of an LED device package 1900 that is usable for an LED device array in which an LED device 1910 manufactured using a CVD apparatus is arranged, according to an embodiment.

Specifically, in the LED device package 1900 as an example of the chip scale package, an electrode may be formed through the bottom surface of the LED device 1910 that is an opposite direction to a main light extraction surface, and a phosphor layer 1907 and a lens 1920 may be integrally formed. The LED device package 1900 may include a light-emitting structure S, first and second terminals Ta and Tb, the phosphor layer 1970, and the lens 1920, which are disposed on a substrate 1911.

The light-emitting structure S may be a stack structure including first and second conductivity type semiconductor layers 1904 and 1906 and an active layer 1905 disposed between therebetween. The light-emitting structure S may be manufactured using any one of the above-described CVD apparatuses 100 to 600 or other CVD apparatuses according to various embodiments. In this embodiment, the first conductivity type semiconductor layer 1904 and the second conductivity type semiconductor layer 1906 may be a p-type semiconductor layer and an n-type semiconductor layer, respectively, and may include nitride semiconductor, for example, $Al_xIn_yGa_{(1-x-y)}N$ ($0<x<1$, $0<y<1$, $0<x+y<1$). In addition to the nitride semiconductor, GaAs-based semiconductor, a GaP-based semiconductor, or other similar semiconductor may be used.

The active layer 1905, which is formed between the first conductivity type semiconductor layer 1904 and the second conductivity type semiconductor layer 1906, may be configured to emit light having predetermined energy due to recombination of electrons and holes and may have an MQW structure in which a quantum well layer and a quantum barrier layer are alternately stacked. In the case of the MQW structure, for example, an InGaN/GaN or AlGaN/GaN structure may be used.

The LED device 1910 may be in a state where a growth substrate is removed, and unevenness P may be formed on the surface of the LED device 1910 from which the growth substrate is removed. In addition, the phosphor layer 1907 may be formed on the uneven surface of the LED device 1910 as a light conversion layer. The LED device 1910 may include first and second electrodes 1909*a* and 1909*b* respectively connected to the first and second conductivity semiconductor layers 1904 and 1906. The first electrode 1909*a* may include a conductive via that passes through the second conductivity type semiconductor layer 1906 and the active layer 1905 and is connected to the first conductivity type semiconductor layer 1904. In the conductive via 1908, an insulating layer 1903 may be formed between the active layer 1905 and the second conductivity type semiconductor layer 1906, thus preventing a short circuit.

One conductive via 1908 is illustrated, but two or more conductive vias 1908 may be provided so as to improve current dispersion. The conductive vias 1908 may be arranged in various forms. The arrangement of the conductive via 1908 may be configured in the same manner as the contents described above with reference to FIG. 15 or other embodiments.

The package substrate 1911 may be a support substrate, such as a silicon substrate, to which a semiconductor process may be more easily applicable; however embodiments are not limited thereto. The package substrate 1911 and the LED device 1910 may be attached to each other by bonding layers 1902 and 1912. The bonding layers 1902 and 1912 may include an electrically insulating material or an electrically conductive material. Examples of the electrically insulating material may include oxide such as SiO2 or SiN, or a resin material such as a silicon resin or an epoxy resin. Examples of the electrically conductive material may include Ag, Al, Ti, W, Cu, Sn, Ni, Pt, Cr, NiSn, TiW, AuSn, or eutectic metal thereof. The above process may be performed by applying the first and second bonding layers 1902 and 1912 on the bonding surfaces of the LED device 1910 and the substrate 1911 and attaching the LED device 1910 and the substrate 1911.

Vias may be formed from the bottom surface of the package substrate 1911 so as to connect the first and second electrodes 1909*a* and 1909*b* of the LED device 1910 attached thereto. An insulator 1913 may be formed on the side of the via and the bottom surface of the package substrate 1911. In a case where the package substrate 1911 is a silicon substrate, the insulator 1913 may be provided as a silicon oxide film through a thermal oxidation process. The first and second terminals Ta and Tb may be formed by filling the vias with a conductive material, so as to connect to the first and second electrodes 1909*a* and 1909*b*. The first terminal Ta may include a seed layer 1918*a* and a plating charged unit 1919*a* formed using the seed layer 1918*a* by plating, and the second terminal Tb may include a seed layer 1918*b* and a plating charged unit 1919*b* formed using the seed layer 1918*b* by plating.

Figure 19:
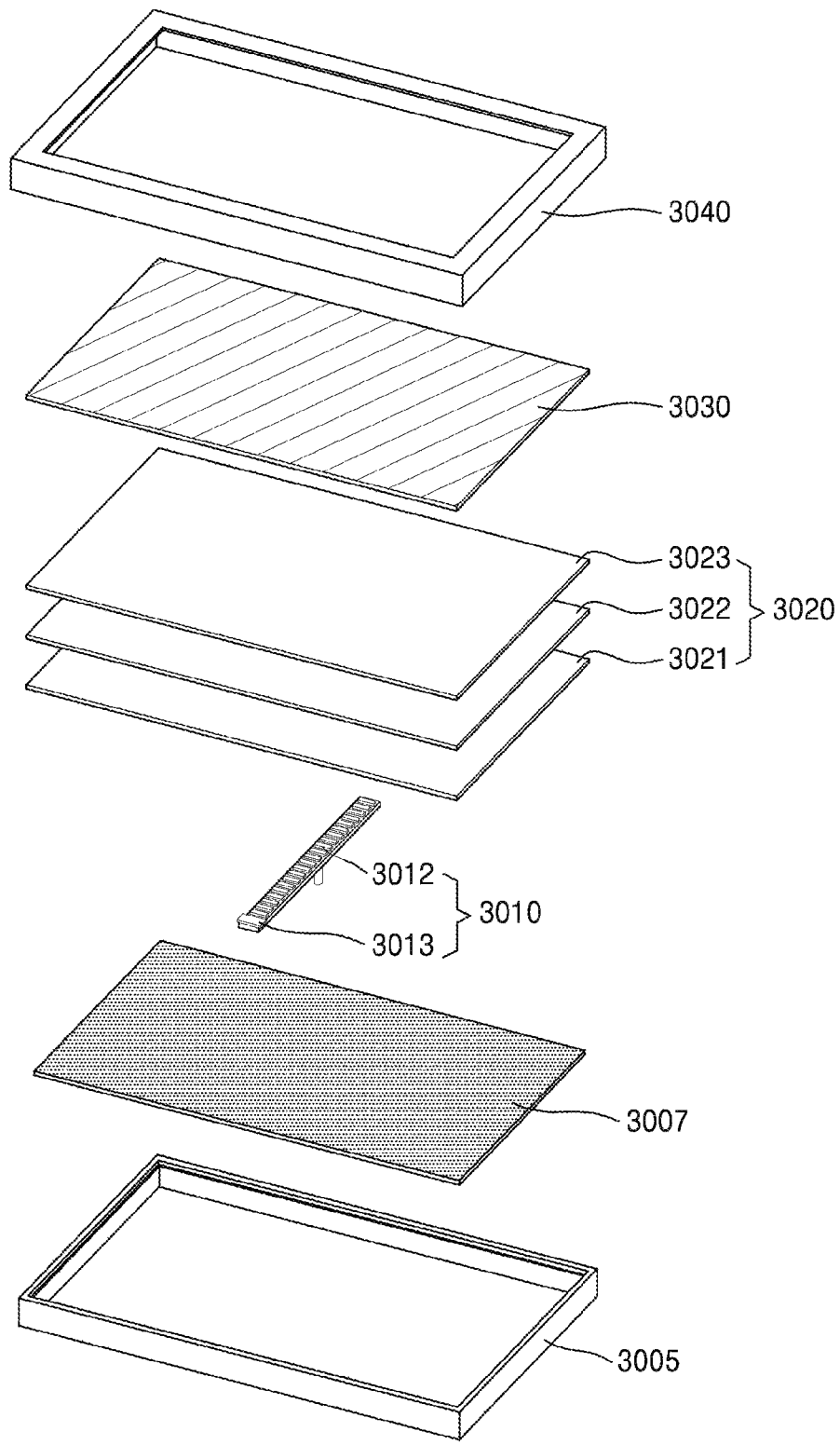
FIG. 19 is a side sectional view of an example of a backlight assembly including an LED device array unit in which an LED device manufactured using a CVD apparatus is arranged, according to an embodiment.

FIG. 19 is a side sectional view of an example of a direct-type backlight assembly 3000 including an LED device array in which an LED device manufactured using a CVD apparatus is arranged, according to an embodiment. Specifically, the direct-type backlight assembly 3000 may include a lower cover 3005, a reflection sheet 3007, a light-emitting module 3010, an optical sheet 3020, a liquid crystal panel 3030, and an upper cover 3040. In this embodiment, the LED device array may be used as the light-emitting module 3010 included in the direct-type backlight assembly 3000.

In this embodiment, the light-emitting module 3010 may include an LED device array 3012 and a rank storage unit 3013. The LED device array 3012 may include at least one LED device package and a circuit board. In some embodiments, the rank storage unit 3013 may store rank information of the LED device array 3012. The LED device array 3012 may be configured to receive power for light emission from an LED device driving unit disposed outside the direct-type backlight assembly 3000. The LED device driving unit may be configured to detect the rank information of the LED device array 3012 that is stored in the rank storage unit 3013, and adjust a current or the like supplied to the LED device array 3012, based on the detected rank information.

The optical sheet 3020 may be disposed on the light-emitting module 3010 and may include a diffusion sheet 3021, a light concentration sheet 3022, and a protection sheet 3023. That is, the diffusion sheet 3021 that diffuses light emitted from the light-emitting module 3010, the light concentration sheet 3022 that concentrates the light diffused from the diffusion sheet 3021 and increases luminance, and the protection sheet 3023 that protects the light concentration sheet 3022 and secures a viewing angle may be sequentially provided on the light-emitting module 3010. The upper cover 3040 may cover the edge of the optical sheet 3020 and be assembled with the lower cover 3005.

The liquid crystal panel 3030 may be further provided between the optical sheet 3020 and the upper cover 3040. The liquid crystal panel 3030 may include a pair of substrates, that is, a first substrate (not illustrated) and a second substrate (not illustrated), which are attached to face each other, with a liquid crystal layer being disposed therebetween. In the first substrate, multiple gate lines and multiple data lines interest with each other to define pixel regions. Thin film transistors (TFTs) may be provided at intersections of the pixel regions and are respectively connected to pixel electrodes mounted in the pixel regions. The second substrate may include R, G, and B color filters corresponding to the pixel regions, and a black matrix that covers the edges of the R, G, and B color filters, the gate lines, the data lines, and the TFTs.

Figure 20:
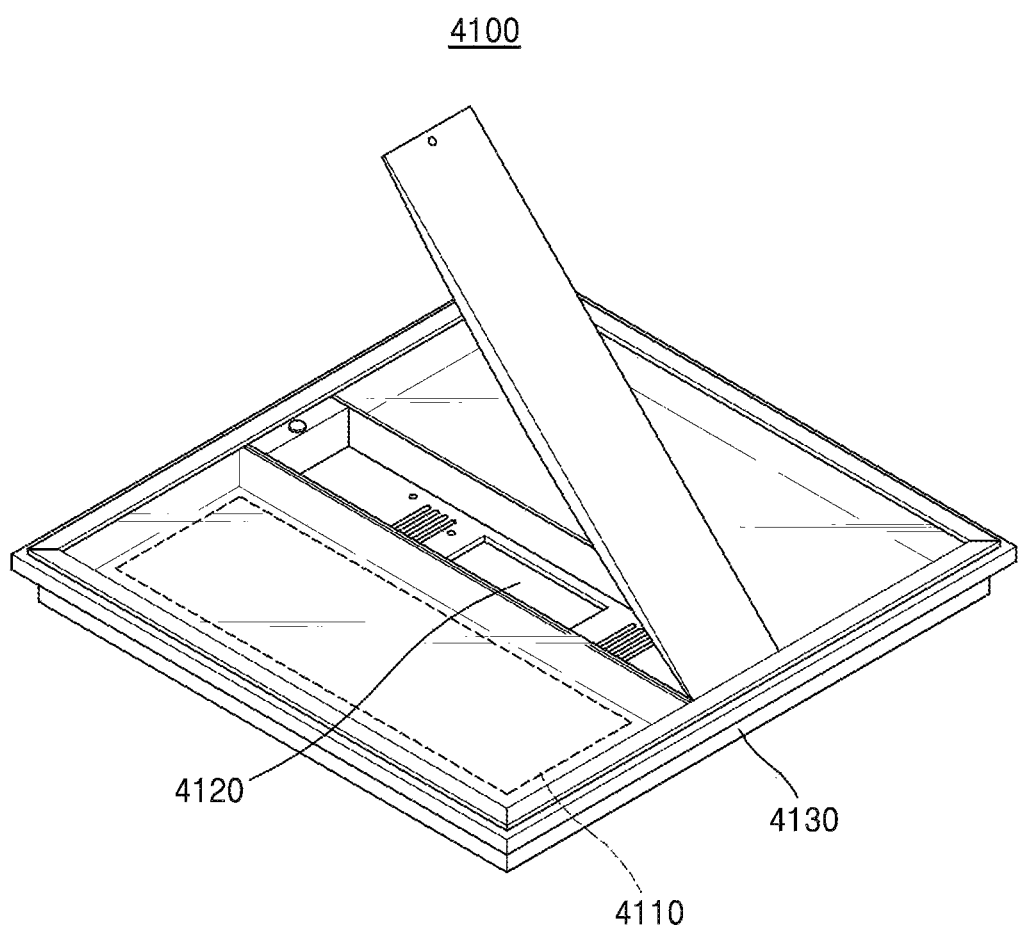
FIG. 20 is a perspective view of a flat-panel lighting apparatus including an LED device array unit, in which an LED device manufactured using a CVD apparatus is arranged, and an LED device module, according to an embodiment.

FIG. 20 is a perspective view of a flat-panel lighting apparatus including an LED device array unit, in which an LED device manufactured using a CVD apparatus is arranged, and an LED device module, according to an embodiment. Specifically, the flat-panel lighting apparatus 4100 may include a light source 4110, a power supply 4120, and a housing 4130. In this embodiment, the light source 4110 may include the above-described LED device array unit, and the power supply 4120 may include the above-described LED device driving unit.

The light source 4110 may include the LED device array and may be formed to have a flat shape as a whole. In this embodiment, the LED device array unit may include an LED device array and a rank storage unit that stores rank information of the LED device array.

The power supply 4120 may be configured to supply power to the light source 4110. In this embodiment, the power supply 4120 may include a variable current output unit and a rank detection unit. The variable current output unit and the rank detection unit may perform the same functions as those of a variable current output unit and a rank detection unit included in any one of the embodiments described herein.

The housing 4130 may form an accommodation space for accommodating the light source 4110 and the power supply 4120. The housing 4130 is formed to have a hexahedral shape whose one side is opened, but is not limited thereto. The light source 4110 may be disposed to emit light toward the opened side of the housing 4130.

Figure 21:
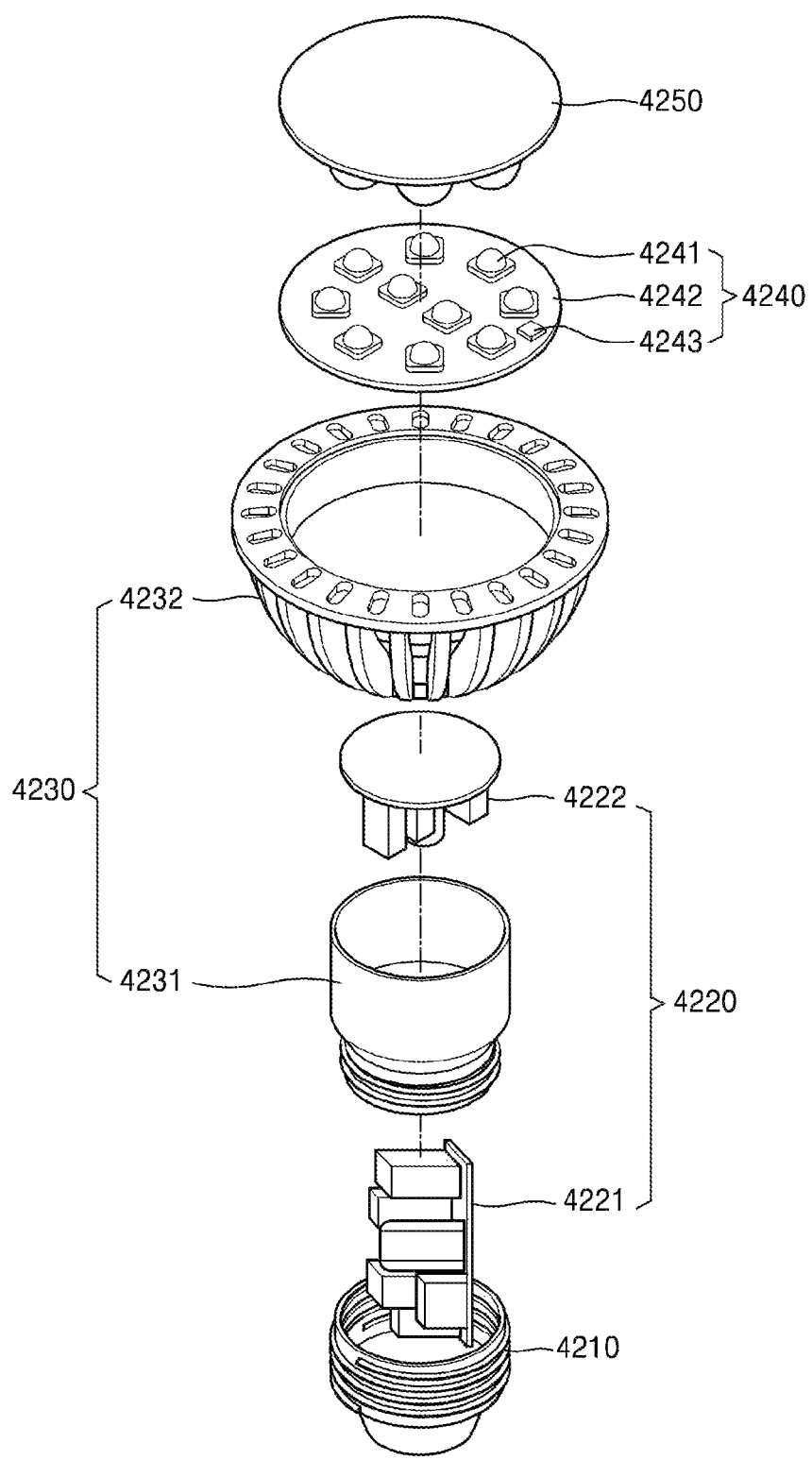
FIG. 21 is an exploded perspective view of a bulb lamp as a lighting apparatus including an LED device array unit, in which an LED device manufactured using a CVD apparatus is arranged, and an LED device module, according to an embodiment.
Figure 22:
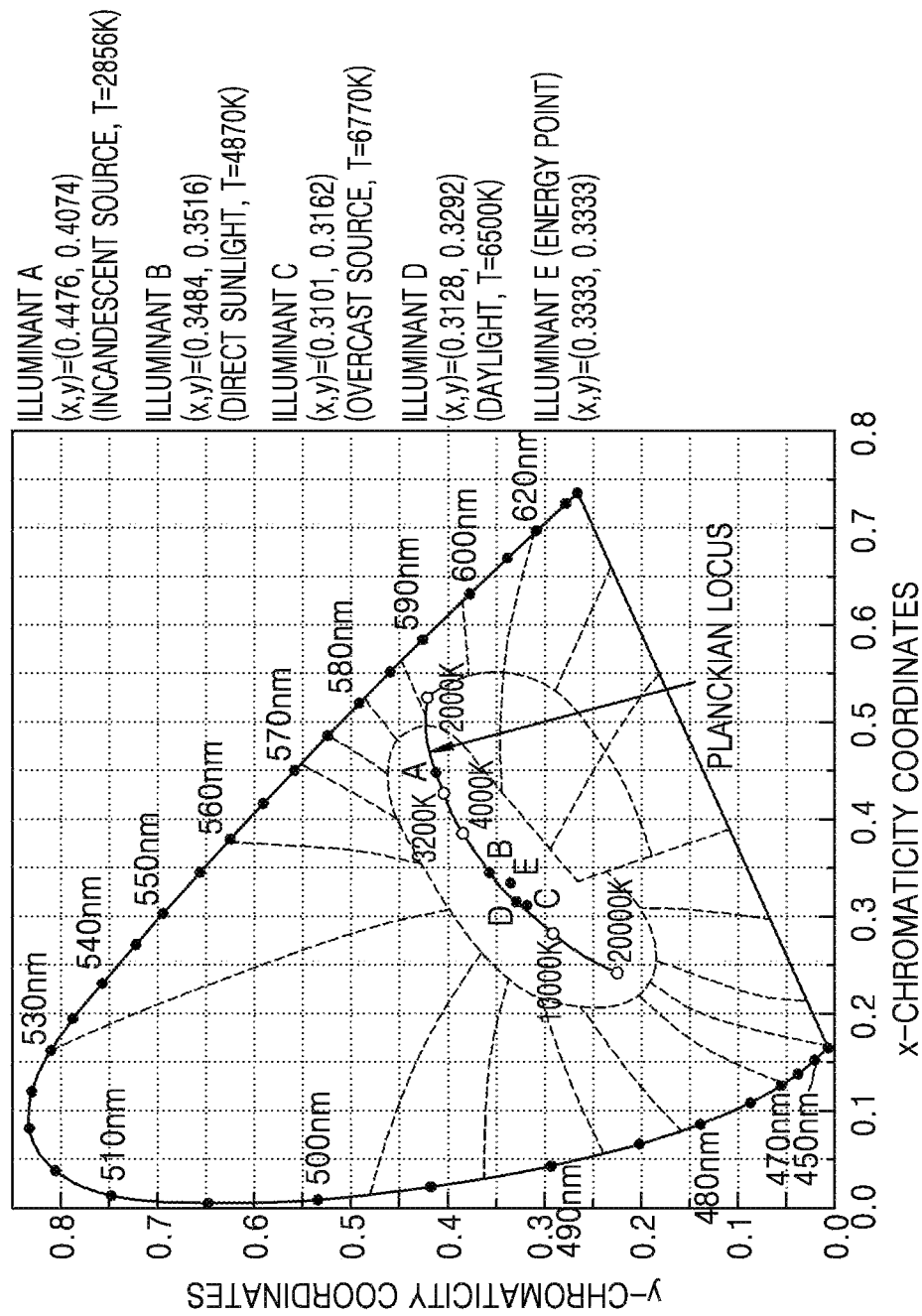
FIG. 22 is a CIE chromaticity diagram illustrating a perfect radiator spectrum that is usable for an LED device manufactured using a CVD apparatus, according to an embodiment.

FIG. 21 is an exploded perspective view of a bulb lamp as a lighting apparatus 4200 including an LED device array, in which an LED device manufactured using a CVD apparatus is arranged, and an LED device module, according to an embodiment. FIG. 22 is a CIE chromaticity diagram illustrating a radiator spectrum that is usable for an LED device manufactured using a CVD apparatus, according to an embodiment.

Specifically, the lighting apparatus 4200 may include a socket 4210, a power supply 4220, a heat sink 4230, a light source 4240, and an optical unit 4250. In this embodiment, the light source 4240 may include the above-described LED device array unit, and the power supply 4220 may include the above-described LED device driving unit.

The socket 4210 may be configured to interface with a variety of lighting fixtures including standard lighting fixtures. Power may be supplied to the lighting apparatus 4200 through the socket 4210. As illustrated in FIG. 21, the power supply 4220 may include a first power supply 4221 and a second power supply 4220. The power supply 4220 may include the LED device driving unit according to various embodiments. For example, the power supply 4220 may include a variable current output unit and a rank detection unit.

The heat sink 4230 may include an internal heat sink 4231 and an external heat sink 4232. The internal heat sink 4231 may be directly connected to the light source 4240 and/or the power supply 4220. The internal heat sink 4231 may be configured to transfer heat to the external heat sink 4232. The optical unit 4250 may include an internal optical unit (not illustrated) and an external optical unit (not illustrated). The optical unit 4250 may be configured to substantially uniformly disperse light emitted from the light source 4240.

The light source 4240 may receive power from the power supply 4220 and emit light to the optical unit 4250. The light source 4240 may include the LED device array unit according to one or more embodiments described herein. The light source 4240 may include one or more LED device packages 4241, a circuit board 4242, and a rank storage unit 4243. The rank storage unit 4243 may store rank information of the LED device packages 4241.

The LED device packages 4241 included in the light source 4240 may be the same or similar type that generates light having the same or similar wavelength. Alternatively, the LED device packages 4241 may be different types that generate light having different wavelengths. For example, the LED device packages 4241 may be configured to include at least one of an LED device emitting white light by combining a yellow, green, red, or orange color phosphor in a blue LED device, and a violet, blue, green, red, or infrared LED device and adjust a color temperature and a color rendering index (CRI) of the white light. Alternatively, when the LED chip emits blue light, the LED device package including at least one of the yellow, green, and red phosphors may be configured to emit white light of various color temperatures according to a combination ratio of the phosphors. Alternatively, the LED device package, in which the green or red phosphor is applied to the blue LED chip, may be configured to emit green or red light. The color temperature and the CRI of the white light may be adjusted by combining the LED device package emitting the white light and the LED device package emitting the green or red light. Alternatively, the LED device package may include at least one of LED devices emitting the violet, blue, green, red, and infrared light In this case, the lighting apparatus 4200 may adjust the CRI to a photovoltaic level in a sodium (Na) lamp. In addition, the lighting apparatus 4200 may generate a variety of white light having a color temperature of about 1,500K to about 20,000K. The lighting apparatus 4200 may adjust an illumination color according to a surrounding atmosphere or a mood by generating infrared light or visible light such as violet, blue, green, red, or orange color light. In addition, the lighting apparatus 4200 may generate light of a specific wavelength so as to promote the growth of plants.

The white light, which is generated by the combination of the yellow, green and red phosphors in the blue LED device and/or by the combination of green and red LED devices has two or more peak wavelengths. As illustrated in FIG. 22, (x, y) coordinates of the white light in the CIE 1931 coordinate system may be positioned within a line segment region connecting coordinates (0.4476, 0.4074), (0.3484, 0.3516), (0.3101, 0.3162), (0.3128, 0.3292), and (0.3333, 0.3333). Alternatively, the (x, y) coordinates may be positioned in a region surrounded by the line segment and a black-body radiator spectrum. The color temperature of the white light is in the range of about 1,500K to about 20,000K.

Figure 23A:
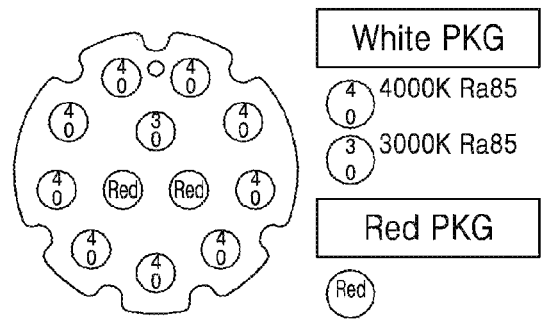
FIGS. 23A-23B are diagrams of examples of an LED device package in which an LED device manufactured using a CVD apparatus is arranged, according to some embodiments.
Figure 23B:
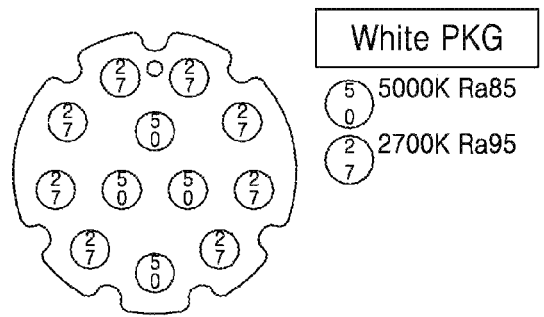

FIGS. 23A and B are diagrams of example of LED device packages in which an LED device manufactured using a CVD apparatus is arranged, according to various embodiments. Specifically, a white LED package module, which is capable of adjusting a color temperature in the range of about 3,000K to about 4,000K and has a CRI of about 85 to about 99, may be manufactured by combining a red LED device package and a white LED device package having a color temperature of about 4,000K to about 3,000K. The white LED package module may correspond to the light source 4240 of FIG. 21 and a light source 4340 of FIG. 24.

According to another embodiment, a white LED package module, which may be capable of adjusting a color temperature in the range of about 2,700K to about 5,000K and has a CRI of about 85 to about 99, may be manufactured by combining a white LED device package having a color temperature of about 2,700K and a white LED device package having a color temperature of about 5,000K. The number of LED device packages for each color temperature may be changed according to a basic color temperature setting value. In the lighting apparatus, of which the basic color temperature setting value is around a color temperature of 4,000K, the number of packages corresponding to a color temperature of 4,000K is larger than the number of packages corresponding to a color temperature of 3,000K or the number of red LED device packages.

The phosphor may have the following empirical formulas and colors.

Oxide: yellow color and green color $Y_3Al_5O_{12}$:Ce, $Tb_3Al_5O_{12}$:Ce, $Lu_3Al_5O_{12}$:Ce Silicate: yellow color and green color $(Ba,Sr)_2SiO_4$:Eu, yellow color and orange color $(Ba,Sr)_3SiO_5$:Ce Nitride: green color β-SiAlON:Eu, yellow color $L_3Si_6O_{11}$:Ce, orange color α-SiAlON:Eu, red color $CaAlSiN_3$:Eu, $Sr_2Si_5N_8$:Eu, $SrSiAl_4N_7$:Eu, $SrLiAl_3N_4$:Eu, $$Ln_{4-x}(Eu_zM_{1-z})_xSi_{12-y}Al_yO_{3+x+y}N_{18-x-y}(0.5 \leq x \leq 3, 0<z<0.3, 0<y \leq 4) \quad (1)$$

In Formula (1), Ln may be at least one element selected from the group consisting of group IIIa elements and rare-earth elements, and M may be at least one element selected from the group consisting of calcium (Ca), barium (Ba), strontium (Sr), and magnesium (Mg).

Fluoride: KSF-based red color $K_2SiF_6$:$Mn_4^+$, $K_2TiF_6$:$Mn_4^+$, $NaYF_4$:$Mn_4^+$, $NaGdF_4$:$Mn_4^+$ The composition of the phosphor may conform with stoichiometry, and the respective elements may be substituted by other elements included in the respective groups of the periodic table. For example, strontium (Sr) may be substituted by at least one of barium (Ba), calcium (Ca), and magnesium (Mg) of alkaline-earth group II, and Y may be substituted by at least one of terbium (Tb), lutetium (Lu), scandium (Sc), and gadolinium (Gd). In addition, europium (Eu), which is an activator, may be substituted by at least one of cerium (Ce), terbium (Tb), praseodymium (Pr), erbium (Er), and ytterbium (Yb) according to a desired energy level. The activator may be applied solely or a sub activator may be additionally applied to change characteristics. Furthermore, as phosphor alternatives, materials such as quantum dot (QD) may be applied. A phosphor and a QD may be used solely or in combination.

The QD may have a structure including a core (a diameter of about 3 nm to about 10 nm) such as CdSe or InP, a shell (a thickness of about 0.5 nm to about 2 nm) such as ZnS or ZnSe, and a ligand for stabilizing the core and the shell and may implement various colors according to sizes.

In this embodiment, the wavelength conversion material is described as being in the sealing material, but the wavelength conversion material may be attached to the top surface of the LED chip in a film type and may be coated on the top surface of the LED chip at a uniform thickness.

Table 1 below shows types of phosphors according to applications of a white light-emitting device using a blue LED chip (about 440 nm to about 460 nm).

TABLE 1

| Usage | Phosphor |
| --- | --- |
| LED TV BLU | β-SiAlON:Eu2+ |
|  | (Ca,Sr)AlSiN3:Eu2+ |
|  | $La_3Si_6N_{11}$:Ce3+ |
|  | $K_2SiF_6$:Mn4+ |
|  | $SrLiAl_3N_4$:Eu |
|  | $Ln_{4-x}(Eu_zM_{1-z})_xSi_{12-y}Al_yO_{3+x+y}N_{18-x-y}$ |
|  | (0.5 ≤ x ≤ 3, 0 < z < 0.3, 0 < y ≤ 4) |
|  | K2TiF6:Mn4+ |
|  | NaYF4:Mn4+ |
|  | NaGdF4:Mn4+ |
| Illumination | $Lu_3Al_5O_{12}$:Ce3+ |
|  | Ca-α-SiAlON:Eu2+ |
|  | $La_3Si_6N_{11}$:Ce3+ |
|  | (Ca,Sr)AlSiN3:Eu2+ |
|  | $Y_3Al_5O_{12}$:Ce3+ |
|  | $K_2SiF_6$:Mn4+ |
|  | SrLiAl3N4:Eu |
|  | $Ln_{4-x}(Eu_zM_{1-z})_xSi_{12-y}Al_yO_{3+x+y}N_{18-x-y}$ |
|  | (0.5 ≤ x ≤ 3, 0 < z < 0.3, 0 < y ≤ 4) |
|  | $K_2TiF_6$:Mn4+ |
|  | NaYF4:Mn4+ |
|  | NaGdF4:Mn4+ |
| Side View (Mobile, Note PC) | $Lu_3Al_5O_{12}$:Ce3+ |
|  | Ca-α-SiAlON:Eu2+ |
|  | $La_3Si_6N_{11}$:Ce3+ |
|  | (Ca,Sr)AlSiN3:Eu2+ |
|  | $Y_3Al_5O_{12}$:Ce3+ |
|  | (Sr,Ba,Ca,Mg)2SiO4:Eu2+ |
|  | $K_2SiF_6$:Mn4+ |

TABLE 1-continued

| Usage | Phosphor |
|---|---|
| Electrical Component (Head Lamp, etc.) | SrLiAl3N4:Eu<br>$Ln_{4-x}(Eu_zM_{1-z})_xSi_{12-y}Al_yO_{3+x+y}N_{18-x-y}$<br>$(0.5 \le x \le 3, 0 < z < 0.3, 0 < y \le 4)$<br>K2TiF6:Mn4+<br>NaYF4:Mn4+<br>NaGdF4:Mn4+<br>$Lu_3Al_5O_{12}$:Ce3+<br>Ca-α-SiAlON:Eu2+<br>$La_3Si_6N_{11}$:Ce3+<br>(Ca,Sr)AlSiN$_3$:Eu2+<br>$Y_3Al_5O_{12}$:Ce3+<br>$K_2SiF_6$:Mn4+<br>SrLiAl3N4:Eu<br>$Ln_{4-x}(Eu_zM_{1-z})_xSi_{12-y}Al_yO_{3+x+y}N_{18-x-y}$<br>$(0.5 \le x \le 3, 0 < z < 0.3, 0 < y \le 4)$<br>K2TiF6:Mn4+<br>NaYF4:Mn4+<br>NaGdF4:Mn4+ |

Figure 24:
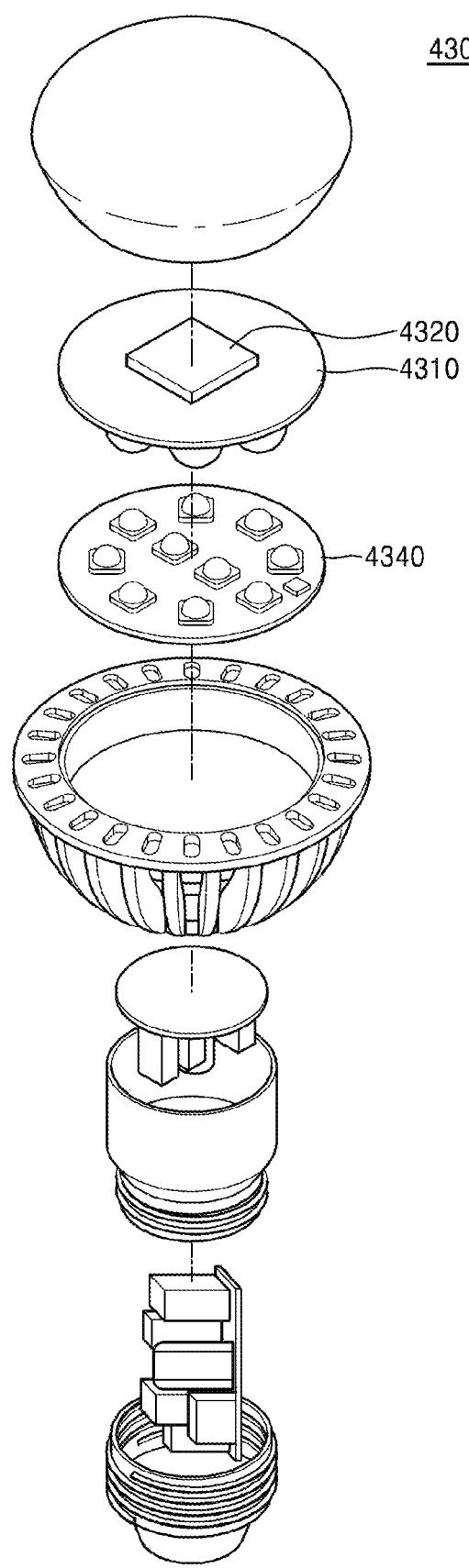
FIG. 24 is an exploded perspective view of a lamp including an LED device array unit, in which an LED device manufactured using a CVD apparatus is arranged, an LED device module, and a communication module, according to an embodiment.

FIG. 24 is an exploded perspective view of a lamp including an LED device array unit, in which an LED device manufactured using a CVD apparatus is arranged, an LED device module, and a communication module 4320, according to an embodiment.

Specifically, a lighting apparatus 4300 of FIG. 24 differs from the lighting apparatus 4200 of FIG. 21 in that a reflection plate 4310 is provided on a light source 4340. The reflection plate 4310 uniformly disperses light from the light source 4340 in a lateral direction and a rearward direction, thus reducing glare.

The communication module 4320 may be mounted on the reflection plate 4310, and a home network communication may be performed through the communication module 4320. For example, the communication module 4320 may be a wireless communication module using ZigBee and control in-house illumination such as on/off operation or brightness adjustment of a lamp through a smartphone or a wireless controller.

Figure 25:
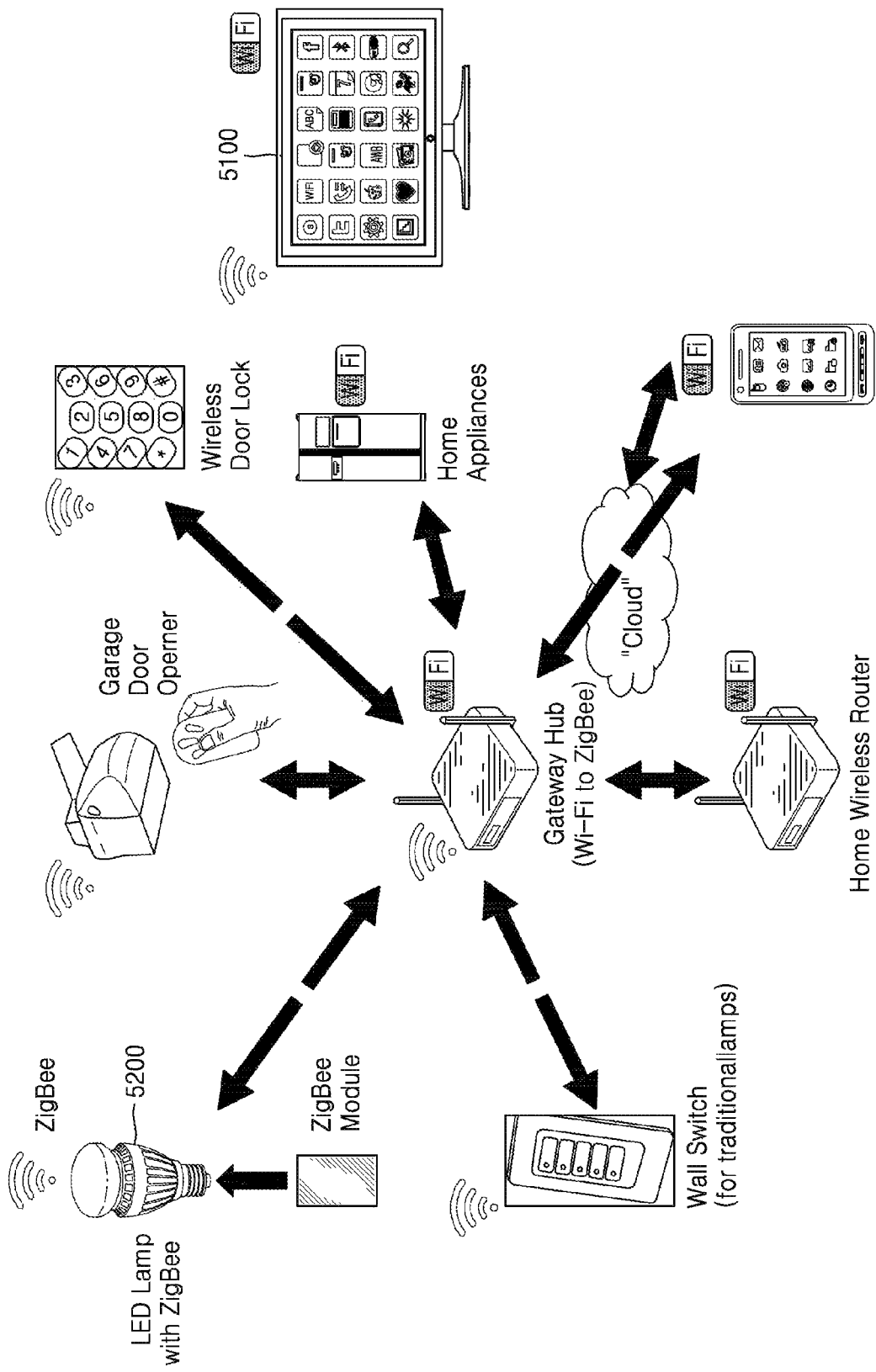
FIG. 25 is a diagram of an example in which a lamp including an LED device array unit, in which an LED device manufactured using a CVD apparatus is arranged, and an LED device module, is applied to a home network, according to an embodiment.

FIG. 25 is a diagram of an example in which a lamp including an LED device array unit, in which an LED device manufactured using a CVD apparatus is arranged, and an LED device module, is applied to a home network, according to an embodiment.

Specifically, by using an in-house wireless communication (Zigbee, WiFi, or the like), it is possible to automatically control the brightness of the lighting apparatus according to an operating state of a bedroom, a living room, an entrance, a storehouse, or home appliances, and a surrounding environment and situation.

For example, the brightness of an LED lamp 5200 may be automatically adjusted using a gateway and a ZigBee module according to a kind of a TV program aired on a TV 5100 or a screen brightness of the TV 5100. For example, in the case of a human drama requiring a cosy atmosphere, the color temperature of the LED lamp 5200 may be adjusted to 5,000K or less. As another example, in the case of a light atmosphere such as a gag program, the color temperature of the LED lamp 5200 is increased to 5,000K or more so that the LED lamp 5200 is adjusted to bluish white light.

The ZigBee module may be integrally modulated with an optical sensor and may be integrally formed with an LED device.

A visible light wireless communication technology is a wireless communication technology that transmits information by wireless by using light of a visible light wavelength the human can recognize with his/her eyes. The visible light wireless communication technology differs from the existing wired optical communication technology and infrared wireless communication in that the light of the visible light wavelength, that is, a specific frequency of visible light from the LED device package, is used, and differs from the wired optical communication technology in that communication environment is a wireless environment. Contrary to the RF wireless communication technology, the visible light wireless communication technology may freely be used without regulation or permission in terms of frequency use. In addition, the visible light wireless communication technology has excellent physical security and has differentiation that enables a user to confirm a communication link with his/her eyes. Furthermore, the visible light wireless communication technology is a convergence technology that is capable of simultaneously obtaining the unique purpose of the light source and the communication function.

In addition, the LED lamp may be used as internal/external light sources for a vehicle. Examples of the internal light source may include various light sources for an interior lamp of a vehicle, a reading light, and a dashboard. Examples, of the external light source may include various light sources for a headlight, a brake light, a turn indicator, a fog lamp, and a running light.

An LED lamp using a specific wavelength may promote the growth of plants and may stabilize a mood or cure a disease. The LED lamp may be applied as light sources for robots or various machine facilities. In connection with the low power consumption and long lifetime of the LED lamp, it is possible to achieve lighting implementation by using ecofriendly renewable energy power system such as solar cells or wind power.

Figure 26:
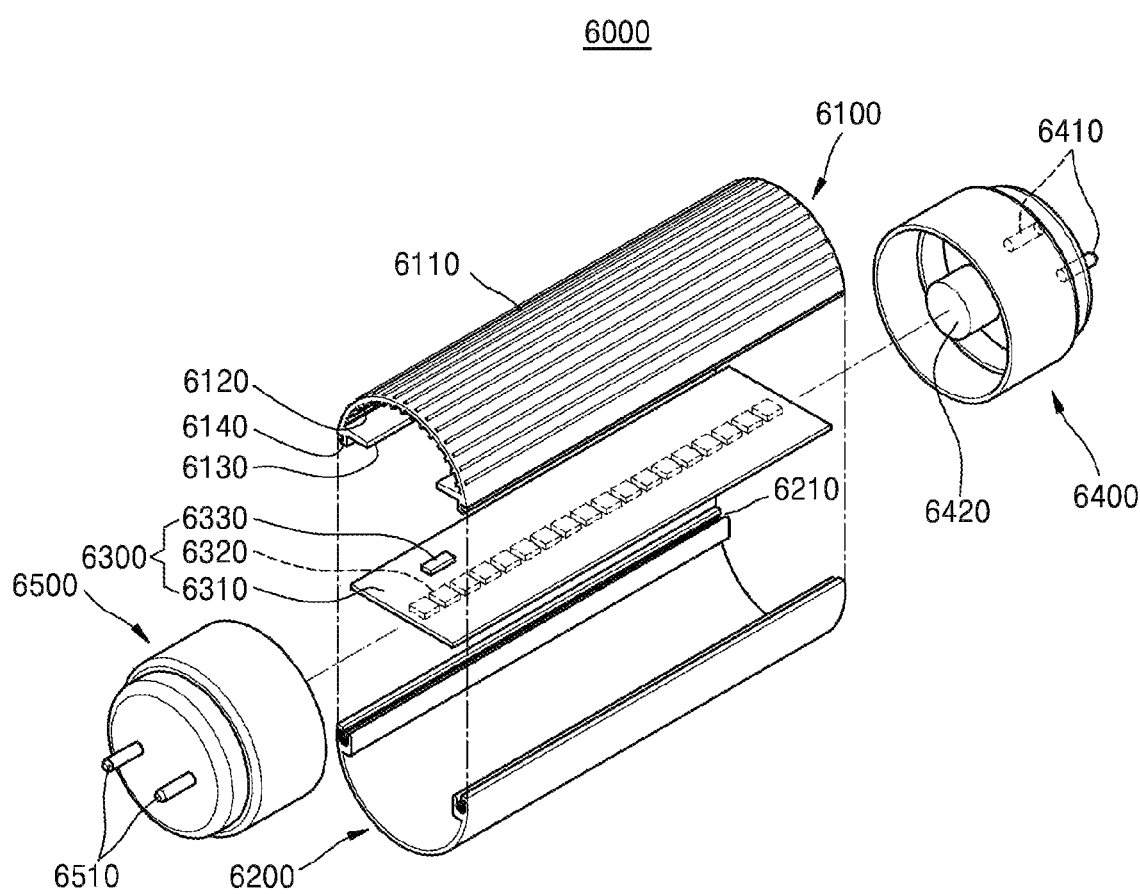
FIG. 26 is an exploded perspective view of a light-emitting apparatus including an LED device array unit, in which an LED device manufactured using a CVD apparatus is arranged, and an LED device module, according to an embodiment.

FIG. 26 is an exploded perspective view of a light-emitting apparatus (lighting apparatus) 6000 including an LED device array unit, in which an LED device manufactured using a CVD apparatus is arranged, and an LED device module, according to an embodiment.

Referring to FIG. 26, the light-emitting apparatus (or lighting apparatus) 6000 may include a heat sink member 6100, a cover 6200, a light-emitting module 6300, a first socket 6400, and a second socket 6500. Multiple heat sink fins 6110 and 6120 having an uneven shape may be formed on inner and/or outer surfaces of the heat sink member 6100. The heat sink fins 6110 and 6120 may be designed to have various shapes and intervals. A support 6130 having a protruding shape may be formed inside the heat sink member 6100. The light-emitting module 6300 may be fixed to the support 6130. Locking protrusions 6140 may be formed on both ends of the cover 6200.

Locking grooves 6210 may be formed in the cover 6200, and locking protrusions 6140 of the heat sink member 6100 may be hooked to the locking grooves 6210. The positions of the locking grooves 6210 may be exchanged with the positions of the locking protrusions 6140.

The light-emitting module 6300 may include the LED device array unit according to one or more embodiments described herein. The light-emitting module 6300 may include a PCB 6310, an LED device array 6320, and a rank storage unit 6330. As described above, the rank storage unit 6330 may store rank information of the LED device array 6320. Circuit wirings may be formed on the PCB 6310 so as to operate the LED device array 6320. In addition, the PCB 6310 may include components for operating the LED device array 6320.

The first and second sockets 6400 and 6500 are provided as a pair of sockets and are connected to both ends of a cylindrical cover unit including the heat sink member 6100 and the cover 6200. For example, the first socket 6400 may include an electrode terminal 6410 and a power supply 6420, and a dummy terminal 6510 may be disposed in the second socket 6500. The power supply 6420 may include the LED device driving unit according to various embodiments. Specifically, the power supply 6420 may include a variable current output unit and a rank detection unit. The variable current output unit and the rank detection unit may perform the same functions as those of the variable current output unit and the rank detection unit included in any one of the embodiments described herein.

In addition, an optical sensor module may be embedded into the first socket 6400 or the second socket 6500. For example, the optical sensor module may be embedded into the second socket 6500 in which the dummy terminal 6510 is disposed. As another example, the optical sensor module may be embedded into the first socket 6400 in which the dummy terminal 6510 is disposed.

An embodiment includes a chemical vapor deposition (CVD) apparatus capable of suppressing deposition of parasitic materials through a smooth flow of a process gas introduced into a chamber.

An embodiment includes a CVD apparatus capable of easily removing parasitic materials deposited within a chamber.

An embodiment includes a method of manufacturing a light-emitting diode (LED) device using the above-described CVD apparatus.

An embodiment includes a CVD apparatus for manufacturing an LED device, including: a chamber; a main disk which is rotatably disposed in a chamber and on which a substrate is mounted; a gas supply unit configured to supply a process gas to the chamber; a skirt unit that is rotatably connected to a peripheral portion of the main disk and enables the process gas to smoothly flow; and a gas collector unit including a gas exhaust channel separate from the skirt unit and installed to be vertically lower than the main disk.

The skirt unit may be integrally formed with the main disk. The skirt unit may have a flat surface parallel to a surface of the substrate disposed on the main disk, and a curved surface connected to the flat surface and curved in a direction of the gas exhaust channel. The flat surface of the skirt unit may be parallel to a flow of the process gas flowing from the gas supply unit to the gas collector unit.

The skirt unit may be installed between the main disk and the gas collector unit and prevent turbulence of the process gas flowing from the gas supply unit to the gas collector unit.

The skirt unit may be rotatably connected to a peripheral portion of the main disk, and parasitic deposition materials deposited around the gas exhaust channel of the gas collector unit may be removed during the rotation of the skirt unit.

The gas exhaust channel of the gas collector unit may be installed adjacent to a peripheral portion of the skirt unit and be disposed under a gap between a sidewall of the chamber and the skirt unit.

The main disk may be formed to have an annular shape, and the skirt unit may be formed to have an annular shape corresponding to the main disk in a peripheral portion of the annular main disk.

The gas exhaust channel may be formed to have an annular shape corresponding to the skirt unit in a peripheral portion of the annular skirt unit.

Multiple rotatable satellite disks may be installed in the main disk, and substrates may be respectively mounted on the satellite disks.

An embodiment includes a CVD apparatus for manufacturing an LED device, including: a chamber; a main disk which is rotatably disposed in a chamber and on which a substrate is mounted; a gas supply unit configured to supply a process gas to the chamber; a skirt unit that is rotatably connected to a peripheral portion of the main disk and enables the process gas to smoothly flow; a gas collector unit including a lower collector disposed under a peripheral portion of the skirt unit, an upper collector separate from the skirt unit and corresponding to a sidewall of the chamber, and a gas exhaust channel disposed on the lower collector between the skirt unit and the upper collector; and a protrusion member installed on the skirt unit, the lower collector, or the upper collector adjacent to the gas exhaust channel and removing parasitic deposition materials deposited on the skirt unit or the upper collector during the rotation of the main disk and the skirt unit.

The skirt unit may have a curved surface curved in a direction of the gas exhaust channel constituting the gas collector unit, and an inner wall of the upper collector corresponding to a sidewall of the chamber may be curved corresponding to the curved surface of the skirt unit.

The main disk may be formed to have an annular shape, and the skirt unit and the gas exhaust channel may be formed to have an annular shape corresponding to the main disk in the peripheral portion of the annular main disk.

The skirt unit may be installed between the main disk and the lower collector and may remove parasitic deposition materials deposited on the gas exhaust channel disposed on the lower collector during the rotation of the skirt unit.

An embodiment includes a CVD apparatus for manufacturing an LED device, including: a chamber; multiple satellite disks which are rotatably disposed in the chamber and on which substrates are mounted; a main disk configured to support and rotate the satellite disks; a gas supply unit configured to supply a process gas to the chamber; a gas collector unit including a lower collector separated from the main disk and disposed to be vertically lower than the main disk, an upper collector separate from the skirt unit and corresponding to a sidewall of the chamber, and a gas exhaust channel disposed on the lower collector between the skirt unit and the upper collector; a skirt unit that is rotatably connected to a peripheral portion of the main disk, has a curved surface curved in a direction of the gas exhaust channel so as to enable the process gas to smoothly flow, and prevents parasitic deposition material between the main disk and the gas collector unit during the rotation of the main disk; and a protrusion member installed on the skirt unit, the lower collector, or the upper collector and removing parasitic deposition materials deposited on the skirt unit or the upper collector adjacent to the gas exhaust channel during the rotation of the main disk and the skirt unit.

The CVD apparatus may include: a skirt unit that is rotatably connected to a peripheral portion of the main disk, has a curved surface curved in a direction of the gas exhaust channel so as to enable the process gas to smoothly flow, and prevents parasitic deposition material between the main disk and the gas collector unit during the rotation of the main disk; and a protrusion member installed on the skirt unit, the lower collector, or the upper collector and removing parasitic deposition materials deposited on the skirt unit or the upper collector adjacent to the gas exhaust channel during the rotation of the main disk and the skirt unit.

The main disk, the skirt unit, and the gas exhaust channel may be annular.

The gas supply unit may be a horizontal gas supply unit installed on a side of the chamber or a vertical gas supply unit installed on an upper portion of the chamber.

The upper collector, the lower collector, and the gas exhaust channel may be fixed members, and the satellite disk, the main disk, and the skirt unit may be rotatable members that are rotatable around the fixed members.

A housing entirely or partially surrounding the chamber may be further installed at the outside of the chamber.

An embodiment includes a method of manufacturing an LED device, including: forming a light-emitting structure on a substrate, the light-emitting structure including a first conductivity type semiconductor layer, an active layer, and a second conductivity type semiconductor layer; and forming a first electrode and a second electrode respectively connected to the first conductivity type semiconductor layer and the second conductivity type semiconductor layer. The forming of the light-emitting structure may include: mounting the substrate on a main disk that is rotatably disposed in a chamber; introducing a process gas from a gas supply unit over the substrate loaded into the chamber and exhausting the process gas through a gas exhaust channel of a gas collector unit, so that the process gas smoothly flows through a skirt unit installed in a peripheral portion of the main disk and is exhausted through the gas exhaust channel of the gas collector unit separate from the main disk and installed to be vertically lower than the main disk; and growing the light-emitting structure on the substrate by reacting the process gas in the chamber.

In the introducing and exhausting of the process gas, an organic metal gas, a carrier gas, and a hydride gas may be introduced into the chamber.

In the introducing and exhausting of the process gas, the skirt unit may have a curved surface curved in a direction of the gas exhaust channel and prevent turbulence of the process gas flowing from the gas supply unit to the gas collector unit.

In the introducing and exhausting of the process gas, a sidewall of the chamber may have a curved surface on the skirt unit and prevent turbulence of the process gas flowing from the gas supply unit to the gas collector unit.

In the introducing and exhausting of the process gas, the skirt unit may be rotated to remove parasitic deposition materials between the main disk and the gas collector unit.

In the introducing and exhausting of the process gas, the gas exhaust channel of the gas collector unit may be disposed under a cap between a sidewall of the chamber and the skirt unit and exhausts the process gas.

The main disk and the skirt unit may be formed to have an annular shape, and the gas exhaust channel of the gas collector unit may be formed to have an annular shape in a peripheral portion of the annular skirt unit and exhaust the process gas in the introducing and exhausting of the process gas.

In the mounting of the substrate on the main disk, multiple rotatable satellite disks may be installed in the main disk, and substrates may be respectively mounted on the satellite disks.

The gas collector unit may include a lower collector, an upper collector corresponding to a sidewall of the chamber, and the gas exhaust channel disposed on the lower collector, a protrusion member may be further formed on the skirt unit, the lower collector, or the upper collector, and when the main disk and the skirt unit are rotated in the introducing and exhausting of the process gas, the protrusion members may remove parasitic deposition materials deposited on the upper collector or the skirt unit adjacent to the gas exhaust channel.

An embodiment includes a method of manufacturing an LED device, including: forming a light-emitting structure on a substrate, the light-emitting structure including a first conductivity type semiconductor layer, an active layer, and a second conductivity type semiconductor layer; and forming a first electrode and a second electrode respectively connected to the first conductivity type semiconductor layer and the second conductivity type semiconductor layer. The forming of the light-emitting structure may be performed using a CVD apparatus. The CVD apparatus may include: a chamber; a main disk which is rotatably disposed in a chamber and on which a substrate is mounted; a gas supply unit configured to supply a process gas to the chamber; a gas collector unit including a gas exhaust channel separate from the main disk and installed to be vertically lower than the main disk; and a skirt unit that is rotatably connected to a peripheral portion of the main disk and enables the process gas to smoothly flow.

The skirt unit may have a flat surface parallel to a surface of the substrate disposed on the main disk, and a curved surface connected to the flat surface and curved in a direction of the gas exhaust channel. The flat surface of the skirt unit may be parallel to a flow of the process gas flowing from the gas supply unit to the gas collector unit.

The skirt unit may be installed between the main disk and the gas collector unit and prevent turbulence of the process gas flowing from the gas supply unit to the gas collector unit.

The skirt unit may be rotatably connected to a peripheral portion of the main disk, and parasitic deposition materials deposited around the gas exhaust channel of the gas collector unit may be removed during the rotation of the skirt unit.

A protrusion member may be further formed on the skirt unit, the lower collector, or the upper collector and remove parasitic deposition materials deposited inside the gas exhaust channel during the rotation of the main disk and the skirt unit.

An embodiment includes a method of manufacturing an LED device, including: forming a light-emitting structure on a substrate, the light-emitting structure including a first conductivity type semiconductor layer, an active layer, and a second conductivity type semiconductor layer; and forming a first electrode and a second electrode respectively connected to the first conductivity type semiconductor layer and the second conductivity type semiconductor layer. The forming of the light-emitting structure may be performed using a CVD apparatus. The CVD apparatus may include: a chamber; a main disk that is rotatably disposed in a chamber and on which a substrate is mounted; a gas supply unit configured to supply a process gas to the chamber; a skirt unit that is rotatably connected to a peripheral portion of the main disk and enables the process gas to smoothly flow; a gas collector unit including a lower collector disposed under a peripheral portion of the skirt unit, an upper collector separate from the skirt unit and corresponding to a sidewall of the chamber, and a gas exhaust channel disposed on the lower collector between the skirt unit and the upper collector; and a protrusion member installed on the skirt unit, the lower collector, or the upper collector adjacent to the gas exhaust channel and removing parasitic deposition materials deposited on the skirt unit or the upper collector during the rotation of the main disk and the skirt unit.

The skirt unit may have a curved surface curved in a direction of the gas exhaust channel constituting the gas collector unit and prevent turbulence of the process gas flowing from the gas supply unit to the gas collector unit.

An inner wall of the upper collector corresponding to the sidewall of the chamber may be curved on the skirt unit and prevent turbulence of the process gas flowing from the gas supply unit to the gas collector unit.

The main disk may be formed to have an annular shape, and the skirt unit and the gas exhaust channel may be formed to have an annular shape corresponding to the main disk in a peripheral portion of the annular main disk and may be configured to exhaust the process gas.

The skirt unit may be installed between the main disk and the lower collector and remove parasitic deposition materials deposited on the gas exhaust channel disposed on the lower collector during the rotation of the skirt unit.

The gas exhaust channel of the gas collector unit may be disposed under a cap between the sidewall of the chamber and the skirt unit and exhaust the process gas.

While embodiments have been particularly shown and described with reference to particular embodiments thereof, it will be understood that various changes in form and details may be made therein without departing from the spirit and scope of the following claims.

What is claimed is:

1. An apparatus, comprising:
   a chamber;
   a main disk that is rotatably disposed in a chamber and configured to receive a substrate;
   a gas supply unit configured to supply a process gas to the chamber;
   a gas collector unit including a gas exhaust channel separate from the main disk and vertically lower than the main disk; and
   a skirt unit disposed on a peripheral portion of the main disk and configured to reduce turbulence of the process gas flowing to the gas collector unit.

2. The apparatus of claim 1, wherein:
   the skirt unit comprises a flat surface substantially parallel to a surface of the main disk, and a curved surface connected to the flat surface and curved towards the gas exhaust channel; and
   the flat surface of the skirt unit is substantially parallel to the flow of the process gas flowing from the gas supply unit to the gas collector unit.

3. The apparatus of claim 1, wherein the skirt unit is configured to reduce turbulence of the process gas flowing from the gas supply unit to the gas collector unit.

4. The apparatus of claim 1, wherein the skirt unit is configured to remove parasitic deposition materials between the main disk and the gas collector unit when the skirt unit rotates.

5. The apparatus of claim 1, wherein:
   the skirt unit has an annular shape; and
   the gas exhaust channel of the gas collector unit has an annular shape and is disposed in a peripheral portion of the skirt unit.

6. The apparatus of claim 1, wherein the gas collector unit comprises a lower collector disposed under a peripheral portion of the skirt unit, an upper collector separate from the skirt unit and corresponding to a sidewall of the chamber, wherein the gas exhaust channel is disposed on the lower collector between the skirt unit and the upper collector.

7. The apparatus of claim 6, wherein an inner wall of the upper collector includes a sidewall of the chamber and the sidewall is curved towards the gas collector unit.

8. The apparatus of claim 6, further comprising a protrusion member disposed on the skirt unit, the lower collector, or the upper collector adjacent to the gas exhaust channel.

9. An apparatus, comprising:
   a chamber;
   a main disk disposed in the chamber;
   a gas supply unit configured to supply a process gas to the chamber;
   a gas collector unit disposed along a periphery of the main disk and configured to receive the process gas; and
   a skirt unit disposed between the main disk and the gas collector unit, and curved towards the gas collector unit.

10. The apparatus of claim 9, wherein the gas collector unit comprises a gas exhaust channel disposed substantially continuously around the skirt unit.

11. The apparatus of claim 10, further comprising a protrusion disposed adjacent the gas exhaust channel.

* * * * *